United States Patent
Murakawa et al.

(10) Patent No.: US 12,028,612 B2
(45) Date of Patent: Jul. 2, 2024

(54) IMAGING ELEMENT AND IMAGING APPARATUS

(71) Applicants: SONY SEMICONDUCTOR SOLUTIONS CORPORATION, Kanagawa (JP); SONY GROUP CORPORATION, Tokyo (JP)

(72) Inventors: Yusuke Murakawa, Kumamoto (JP); Hideaki Togashi, Kumamoto (JP); Yoshito Nagashima, Kumamoto (JP); Akira Furukawa, Kumamoto (JP); Yoshihiro Ando, Kumamoto (JP); Yasumasa Akutagawa, Kumamoto (JP); Taku Minoda, Kumamoto (JP); Hiroki Iwashita, Kumamoto (JP); Takahito Niwa, Kumamoto (JP); Sho Nishida, Kumamoto (JP); Mikio Ishimaru, Tokyo (JP)

(73) Assignees: Sony Semiconductor Solutions Corporation, Kanagawa (JP); Sony Group Corporation, Tokyo (JP)

( * ) Notice: Subject to any disclaimer, the term of this patent is extended or adjusted under 35 U.S.C. 154(b) by 95 days.

(21) Appl. No.: 17/638,318

(22) PCT Filed: Sep. 3, 2020

(86) PCT No.: PCT/JP2020/033385
§ 371 (c)(1),
(2) Date: Feb. 25, 2022

(87) PCT Pub. No.: WO2021/045139
PCT Pub. Date: Mar. 11, 2021

(65) Prior Publication Data
US 2022/0311943 A1 Sep. 29, 2022

(30) Foreign Application Priority Data
Sep. 6, 2019 (JP) ................................. 2019-162545

(51) Int. Cl.
H04N 23/67 (2023.01)
H01L 27/146 (2006.01)
H04N 25/704 (2023.01)

(52) U.S. Cl.
CPC ..... H04N 23/672 (2023.01); H01L 27/14607 (2013.01); H01L 27/14609 (2013.01);
(Continued)

(58) Field of Classification Search
CPC ................ H04N 23/672; H04N 25/704; H01L 27/14605; H01L 27/14607;
(Continued)

(56) References Cited

U.S. PATENT DOCUMENTS

2015/0002713 A1* 1/2015 Nomura ............ H01L 27/14623
348/302
2015/0028442 A1 1/2015 Miyanami
(Continued)

FOREIGN PATENT DOCUMENTS

| JP | 2015-012127 | 1/2015 |
| JP | 2015-088693 | 5/2015 |

(Continued)

OTHER PUBLICATIONS

International Search Report and Written Opinion prepared by the Japan Patent Office dated Nov. 13, 2020, for International Application No. PCT/JP2020/033385, 3 pgs.

*Primary Examiner* — Lin Ye
*Assistant Examiner* — Chriss S Yoder, III
(74) *Attorney, Agent, or Firm* — Sheridan Ross PC

(57) ABSTRACT

An error is reduced in phase difference detection of an imaging element including a phase difference pixel with an on-chip lens in common for a pair of pixels. The imaging element includes a pixel, an individual on-chip lens, a plurality of phase difference pixels, a common on-chip lens,
(Continued)

and a pixel circuit. The individual on-chip lens individually collects incident light for each pixel. The phase difference pixels are arranged adjacent to each other to detect a phase difference. The common on-chip lens is arranged in common for the plurality of phase difference pixels and collects incident light in common. The pixel circuit is formed in a semiconductor substrate and generates an image signal on the basis of a transferred charge. Charge transfer units of the plurality of phase difference pixels are in a region between the common on-chip lens and the individual on-chip lens.

20 Claims, 21 Drawing Sheets

(52) U.S. Cl.
CPC .. *H01L 27/14614* (2013.01); *H01L 27/14627* (2013.01); *H01L 27/1463* (2013.01); *H04N 25/704* (2023.01)

(58) Field of Classification Search
CPC ......... H01L 27/14609; H01L 27/14614; H01L 27/14621; H01L 27/14623; H01L 27/14627; H01L 27/1463; H01L 27/1464; H01L 27/14641; H01L 27/14643; H10K 39/32; G02B 7/28; G02B 7/34; G02B 7/38

See application file for complete search history.

(56) References Cited

U.S. PATENT DOCUMENTS

| | | |
|---|---|---|
| 2015/0123179 A1 | 5/2015 | Kikuchi |
| 2016/0211306 A1 | 7/2016 | Choi et al. |
| 2016/0337605 A1 | 11/2016 | Ito |
| 2017/0366770 A1 | 12/2017 | Yokogawa et al. |
| 2018/0301509 A1 | 10/2018 | Ishii et al. |
| 2019/0019835 A1* | 1/2019 | Tanaka ................. H04N 25/136 |
| 2019/0088701 A1 | 3/2019 | Mizuta et al. |
| 2019/0109171 A1 | 4/2019 | Ito |

FOREIGN PATENT DOCUMENTS

| | | |
|---|---|---|
| JP | 2015-146364 | 8/2015 |
| JP | 2016-152381 | 8/2016 |
| JP | 2017-168566 | 9/2017 |
| JP | 2017-183562 | 10/2017 |
| JP | 2018-182327 | 11/2018 |
| WO | WO 2013/111628 | 8/2013 |
| WO | WO 2016/098640 | 6/2016 |
| WO | WO 2016/143531 | 9/2016 |
| WO | WO 2017/126326 | 7/2017 |

\* cited by examiner

IMAGING ELEMENT AND IMAGING APPARATUS

CROSS REFERENCE TO RELATED APPLICATIONS

This application is a national stage application under 35 U.S.C. 371 and claims the benefit of PCT Application No. PCT/JP2020/033385, having an international filing date of 3 Sep. 2020, which designated the United States, which PCT application claimed the benefit of Japanese Patent Application No. 2019-162545, filed 6 Sep. 2019, the entire disclosures of each of which are incorporated herein by reference.

TECHNICAL FIELD

The present disclosure relates to an imaging element and an imaging apparatus. Specifically, the present technology relates to an imaging element that detects a phase difference of a subject and an imaging apparatus using the imaging element.

BACKGROUND ART

Conventionally, in a back-illuminated imaging element in which light from a subject is irradiated on a back surface side of a semiconductor substrate on which a photoelectric conversion element such as a photodiode is formed, there is used an imaging element configured to transfer a charge generated by photoelectric conversion on the back surface side of the semiconductor substrate to a front surface side of the semiconductor substrate. For example, there is used an imaging element arranged with an organic photoelectric conversion film adjacent to a back surface side of a semiconductor substrate, and configured to transfer a charge generated by photoelectric conversion in this organic photoelectric conversion film to a front surface side of the semiconductor substrate by using a through electrode (see, for example, Patent Document 1). This charge transferred by the through electrode is converted into an image signal by a circuit element arranged on the front surface side of the semiconductor substrate. Furthermore, the through electrode is arranged between pixels that are regions between pixels that are to be units of photoelectric conversion of incident light.

Furthermore, a phase difference pixel has also been proposed for this imaging element. Here, the phase difference pixel is a pixel for detection of a phase difference of a subject. It is possible to detect a focal position of a subject by the detected phase difference, and apply to auto-focus in which an imaging lens is brought into focus. The phase difference can be detected by pupil split. This pupil split is a method of detecting a phase difference by arranging a pair of pixels that individually convert, into image signals, incident light transmitted through the right side and the left side of the imaging lens. The focal position can be detected by detecting a phase difference between an image based on an image signal transmitted through the right side of the imaging lens and an image transmitted through the right side. The phase difference pixel used for pupil split can be configured by a pixel in which the left side or the right side of the pixel is shielded from light. By irradiating the pixel whose left side and right side are shielded with incident light collected by an on-chip lens, it is possible to perform photoelectric conversion of incident light transmitted through the right side and the left side of the imaging lens. However, output of the image signal of the phase difference pixel is halved by the light shielding. There is a problem that the detection accuracy of the phase difference decreases.

Therefore, a method of performing pupil split by arranging an on-chip lens (common on-chip lens) in common for two adjacent pixels has been proposed. By collecting incident light between pixels of the two pixels by using the common on-chip lens, photoelectric conversion of incident light transmitted through the right side and the left side of the imaging lens can be performed. Since light shielding of the pixel is not performed, it is possible to prevent a decrease in the output of the image signal.

CITATION LIST

Patent Document

Patent Document 1: International Publication No. 2016/143531

SUMMARY OF THE INVENTION

Problems to be Solved by the Invention

In the conventional technique described above, there is a problem that the detection accuracy of the phase difference decreases when the pupil split method using the common on-chip lens is applied. Since the common on-chip lens collects incident light between pixels, there is a problem that, when a structure not contributing to photoelectric conversion, such as the above-described through electrode, is arranged between the pixels, a difference is generated between individual image signals of the pair of phase difference pixels, and an error in phase difference detection increases.

The present disclosure has been made in view of the above-described problems, and an object thereof is to reduce an error in phase difference detection of an imaging element including a phase difference pixel configured by arranging an on-chip lens in common for a pair of pixels.

Solutions to Problems

The present disclosure has been made to solve the above-described problems, and a first aspect thereof is an imaging element including: a pixel including a photoelectric conversion unit configured to perform photoelectric conversion in accordance with incident light and a charge transfer unit configured to transfer a charge generated by the above-described photoelectric conversion; an individual on-chip lens arranged for the above-described pixel each and configured to individually collect the above-described incident light; a plurality of phase difference pixels each including the above-described photoelectric conversion unit and the above-described charge transfer unit and arranged adjacent to each other to detect a phase difference; a common on-chip lens arranged in common for the above-described plurality of phase difference pixels and configured to collect the above-described incident light in common; and a pixel circuit formed in a semiconductor substrate and configured to generate an image signal on the basis of the above-described transferred charge, in which the above-described charge transfer units of the above-described plurality of phase difference pixels are arranged in a region between the above-described common on-chip lens and the above-described individual on-chip lens.

Furthermore, in this first aspect, the above-described pixel circuit may be formed on a front surface side of the above-described semiconductor substrate.

Furthermore, in this first aspect, the above-described photoelectric conversion unit may perform photoelectric conversion of the above-described incident light incident on a back surface, which is formed on the above-described semiconductor substrate and is a surface different from the above-described front surface.

Furthermore, in this first aspect, the above-described charge transfer unit may include a vertical transistor configured to transfer a charge in a thickness direction of the above-described semiconductor substrate.

Furthermore, in this first aspect, the above-described photoelectric conversion unit may include a photoelectric conversion film arranged adjacent to a back surface side of the above-described semiconductor substrate.

Furthermore, in this first aspect, the above-described charge transfer unit may include a through electrode that is an electrode penetrating the above-described semiconductor substrate.

Furthermore, in this first aspect, a color filter that transmits light of a predetermined wavelength in the above-described incident light may be further provided.

Furthermore, in this first aspect, the above-described color filter may be arranged between the above-described photoelectric conversion film, and the above-described individual on-chip lens and the above-described common on-chip lens.

Furthermore, in this first aspect, the above-described color filter may be arranged between the above-described photoelectric conversion film and the above-described semiconductor substrate.

Furthermore, in this first aspect, a separation unit arranged between the above-described photoelectric conversion units of the above-described phase difference pixels may be further provided.

Furthermore, a second aspect of the present disclosure is an imaging apparatus including: a pixel including a photoelectric conversion unit configured to perform photoelectric conversion in accordance with incident light and a charge transfer unit configured to transfer a charge generated by the photoelectric conversion; an individual on-chip lens arranged for the above-described pixel each and configured to individually collect the above-described incident light; a plurality of phase difference pixels each including the above-described photoelectric conversion unit and the above-described charge transfer unit and arranged adjacent to each other to detect a phase difference; a common on-chip lens arranged in common for the above-described plurality of phase difference pixels and configured to collect the above-described incident light in common; a pixel circuit formed in a semiconductor substrate and configured to generate an image signal on the basis of the above-described transferred charge; and a processing circuit configured to process the above-described generated image signal, in which the above-described charge transfer units of the above-described plurality of phase difference pixels are arranged in a region between the above-described common on-chip lens and the above-described individual on-chip lens.

By adopting the aspect described above, there is an effect that the charge transfer unit is arranged in a region different from a region where the common on-chip lens is arranged in plan view. It is assumed that an influence of the charge transfer unit on the light collection of the common on-chip lens is reduced.

MODE FOR CARRYING OUT THE INVENTION

Figure 1:
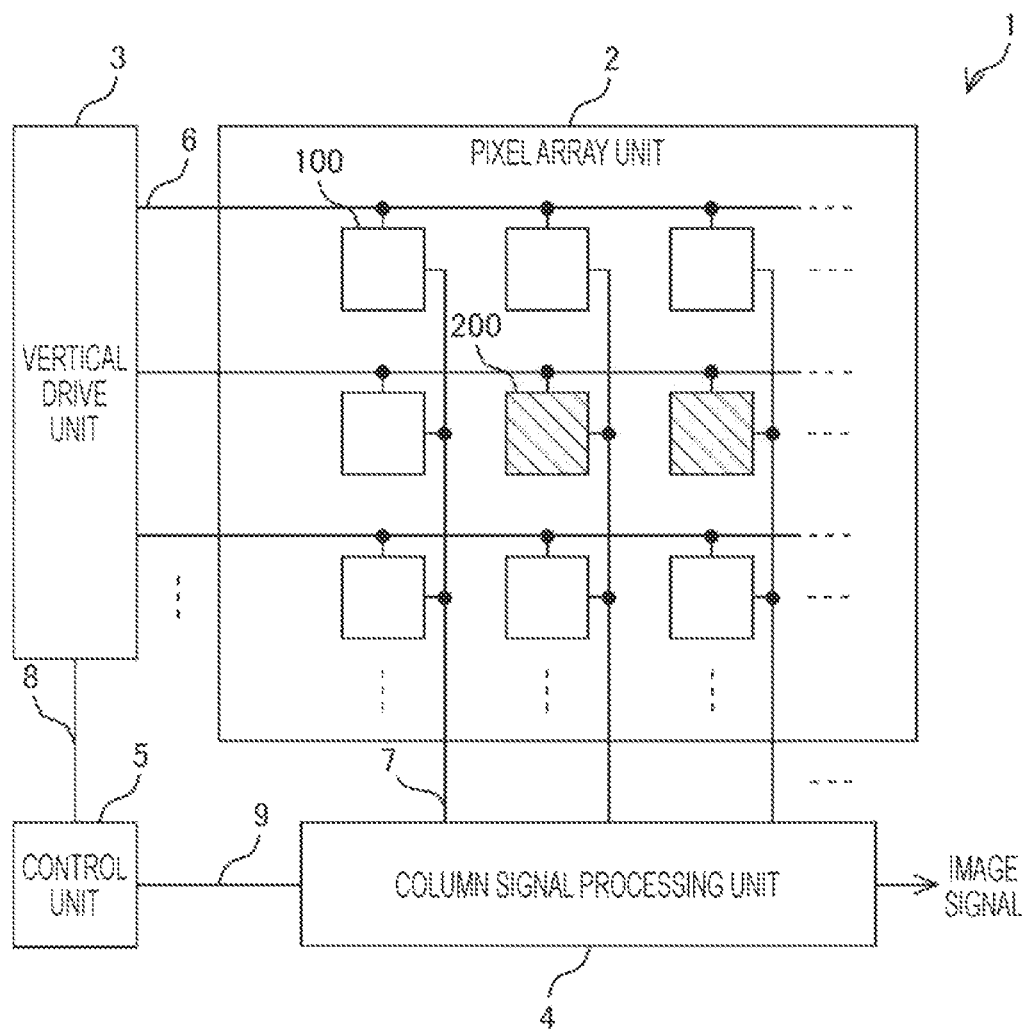
FIG. 1 is a diagram illustrating a configuration example of an imaging element according to an embodiment of the present disclosure.

Next, embodiments for carrying out the present disclosure (hereinafter, referred to as an embodiment) will be described with reference to the drawings. In the following drawings, the same or similar parts are denoted by the same or similar reference numerals. Furthermore, embodiments will be described in the following order.
1. First Embodiment
2. Second Embodiment
3. Third Embodiment
4. Fourth Embodiment
5. Fifth Embodiment
6. Sixth Embodiment
7. Seventh Embodiment
8. Application example to camera
9. Application example to endoscopic surgery system
10. Application example to mobile object 1. First Embodiment

[Configuration of Imaging Element]
FIG. 1 is a diagram illustrating a configuration example of an imaging element according to an embodiment of the present disclosure. An imaging element 1 in the figure includes a pixel array unit 2, a vertical drive unit 3, a column signal processing unit 4, and a control unit 5.

The pixel array unit 2 is configured by arranging a pixel 100 and a phase difference pixel 200 in a two-dimensional lattice shape. Here, the pixel 100 generates an image signal corresponding to irradiated light. This pixel 100 includes a photoelectric conversion unit that generates a charge according to irradiated light. Furthermore, the pixel 100 further includes a pixel circuit. This pixel circuit generates an image signal based on the charge generated by the photoelectric conversion unit. The generation of the image signal is controlled by a control signal generated by the vertical drive unit 3 described later. In the pixel array unit 2, signal lines 6 and 7 are arranged in an XY matrix. The signal line 6 is a signal line that transmits a control signal of the pixel circuit in the pixel 100, is arranged for each row of the pixel array unit 2, and is wired in common to the pixels 100 arranged in each row. The signal line 7 is a signal line that transmits an image signal generated by the pixel circuit of the pixel 100, is arranged for each column of the pixel array unit 2, and is wired in common to the pixels 100 arranged in each column. These photoelectric conversion unit and pixel circuit are formed in a semiconductor substrate.

Furthermore, the phase difference pixel 200 is a pixel that detects a phase difference of a subject. A hatched rectangle of the pixel array unit 2 in the figure represents the phase difference pixel 200. This phase difference pixel 200 performs pupil split while two adjacent phase difference pixels 200 are arranged in a pair. Similarly to the pixel 100, the photoelectric conversion unit and the pixel circuit are also arranged in the phase difference pixel 200, and the signal lines 6 and 7 are connected.

The vertical drive unit 3 generates control signals for the pixel circuits of the pixel 100 and the phase difference pixel 200. This vertical drive unit 3 transmits the generated control signal to the pixel 100 via the signal line 6 in the figure. The column signal processing unit 4 processes image signals generated by the pixel 100 and the phase difference pixel 200. This column signal processing unit 4 processes an image signal transmitted from the pixel 100 via the signal line 7 in the figure. The processing in the column signal processing unit 4 corresponds to, for example, analog-to-digital conversion for converting analog image signals generated in the pixel 100 and the phase difference pixel 200 into digital image signals. The image signal processed by the column signal processing unit 4 is outputted as an image signal of the imaging element 1. The control unit 5 controls the entire imaging element 1. This control unit 5 controls the imaging element 1 by generating and outputting a control signal for controlling the vertical drive unit 3 and the column signal processing unit 4. The control signal generated by the control unit 5 is transmitted to the vertical drive unit 3 and the column signal processing unit 4 by signal lines 8 and 9, respectively. Note that the column signal processing unit 4 is an example of a processing circuit described in the claims.

Figure 2:
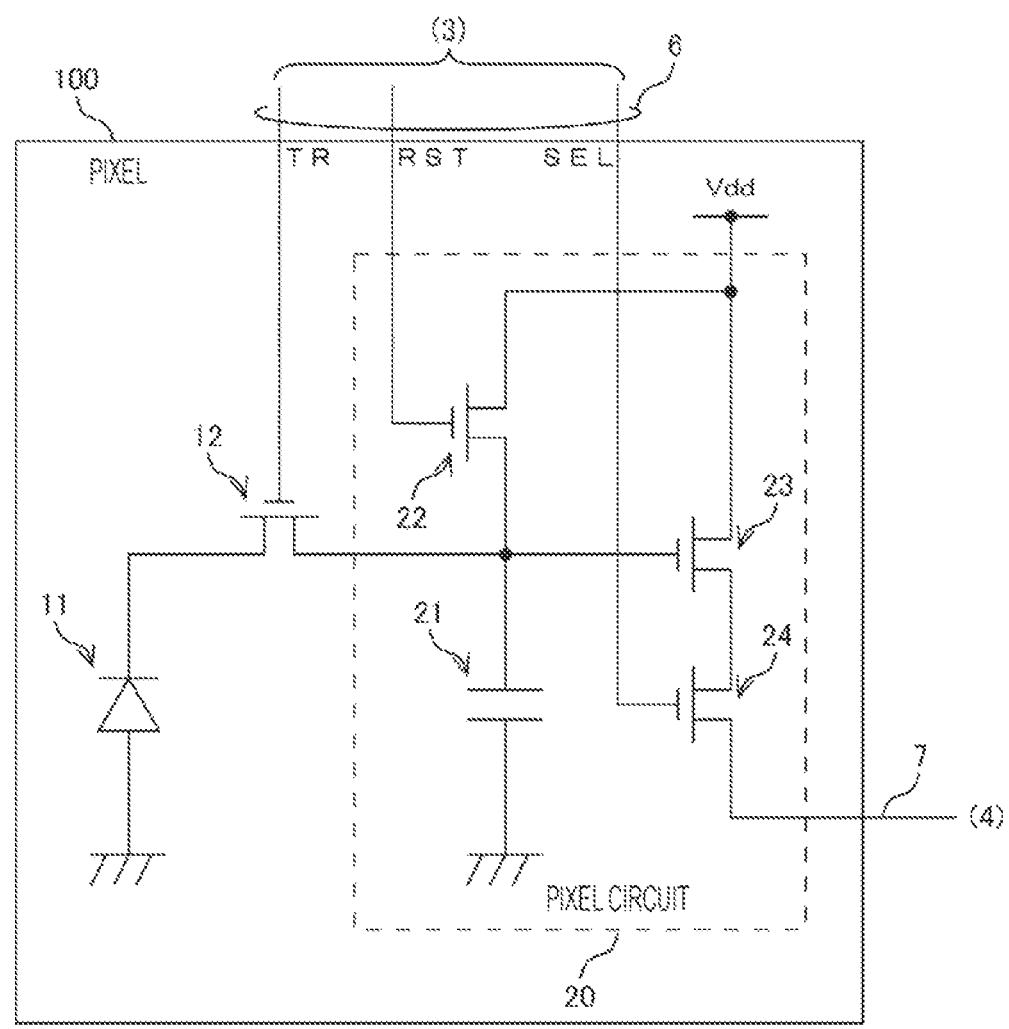
FIG. 2 is a circuit diagram illustrating a configuration example of a pixel according to a first embodiment of the present disclosure.

[Circuit Configuration of Pixel]
FIG. 2 is a circuit diagram illustrating a configuration example of a pixel according to a first embodiment of the present disclosure. The figure is a circuit diagram illustrating a configuration example of the pixel 100. The pixel 100 in the figure includes a photoelectric conversion unit 11, a charge transfer unit 12, a charge holding unit 21, and MOS transistors 22 to 24. Note that, in the figure, the charge transfer unit 12 is assumed to be a MOS transistor.

An anode of the photoelectric conversion unit 11 is grounded, and a cathode is connected to a source of the charge transfer unit 12. A drain of the charge transfer unit 12 is connected to a source of the MOS transistor 22, a gate of the MOS transistor 23, and one end of the charge holding unit 21. Another end of the charge holding unit 21 is grounded. Drains of the MOS transistors 22 and 23 are connected in common to a power supply line Vdd, and a source of the MOS transistor 23 is connected to a drain of the MOS transistor 24. A source of the MOS transistor 24 is connected to the signal line 7. Gates of the charge transfer unit 12 and the MOS transistors 22 and 24 are individually connected to a transfer signal line TR, a reset signal line RST, and a selection signal line SEL. Note that the transfer signal line TR, the reset signal line RST, and the selection signal line SEL constitute the signal line 6.

The photoelectric conversion unit 11 generates a charge corresponding to irradiated light as described above. As this photoelectric conversion unit 11, a photodiode can be used. Furthermore, the charge holding unit 21 and the MOS transistors 22 to 24 constitute a pixel circuit 20.

The charge transfer unit 12 is a transistor configured to transfer a charge generated by photoelectric conversion of the photoelectric conversion unit 11 to the charge holding unit 21. The transfer of the charge in the charge transfer unit 12 is controlled by a signal transmitted by the transfer signal line TR. The charge holding unit 21 is a capacitor that holds the charge transferred by the charge transfer unit 12. The MOS transistor 23 is a transistor that generates a signal based on the charge held in the charge holding unit 21. The MOS transistor 24 is a transistor that outputs the signal generated by the MOS transistor 23 to the signal line 7 as an image signal. This MOS transistor 24 is controlled by a signal transmitted by the selection signal line SEL.

The MOS transistor 22 is a transistor that resets the charge holding unit 21 by discharging the charge held in the charge holding unit 21 to the power supply line Vdd. The reset by this MOS transistor 22 is controlled by a signal transmitted by the reset signal line RST, and is executed before the charge transfer unit 12 transfers the charge. Note that, at the time of this reset, the photoelectric conversion unit 11 can also be reset by electrically connecting the charge transfer unit 12. In this manner, the pixel circuit 20 converts a charge generated by the photoelectric conversion unit 11 into an image signal.

Note that the pixel circuit 20 is a circuit that generates an image signal on the basis of a charge generated by the photoelectric conversion unit 11 and transferred by the charge transfer unit 12. Note that the circuit configuration in the figure can also be applied to the phase difference pixel 200.

[Configuration of Pixel]

Figure 3:
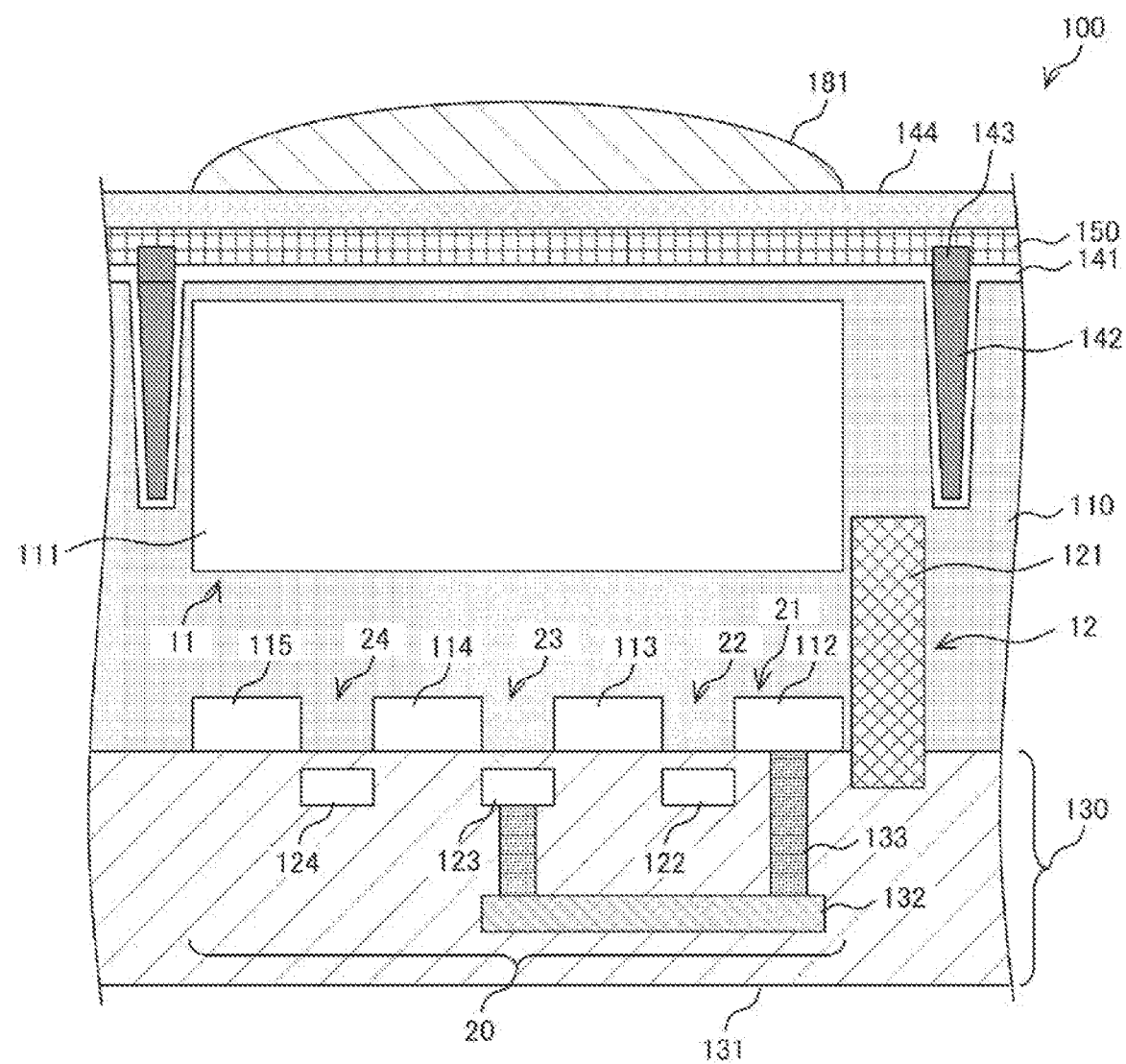
FIG. 3 is a cross-sectional view illustrating a configuration example of the pixel according to the first embodiment of the present disclosure.

FIG. 3 is a cross-sectional view illustrating a configuration example of a pixel according to the first embodiment of the present disclosure. The figure is a schematic cross-sectional view illustrating a configuration example of the pixel 100. The pixel 100 in the figure includes a semiconductor substrate 110, a wiring region 130, a fixed charge film 141, a separation unit 142, a light shielding film 143, a color filter 150, a planarization film 144, and an on-chip lens 181.

The semiconductor substrate 110 is a semiconductor substrate on which the photoelectric conversion unit 11 of the pixel 100, a diffusion region of an element of the pixel circuit 20, and the like are formed. This semiconductor substrate 110 can include, for example, silicon (Si). The photoelectric conversion unit 11 and the diffusion region of the element of the pixel circuit 20 are arranged in a well region formed in the semiconductor substrate 110. For convenience, the semiconductor substrate 110 in the figure is assumed to be configured in a p-type well region. By arranging an n-type semiconductor region in the semiconductor substrate 110 that is the p-type well region, the photoelectric conversion unit 11 and the like can be formed. A rectangle inside the semiconductor substrate 110 represents the n-type semiconductor region. On a front surface side of the semiconductor substrate 110, the wiring region 130 to be described later is formed.

The photoelectric conversion unit 11 includes an n-type semiconductor region 111. Specifically, a photodiode configured by a pn junction at an interface between the n-type semiconductor region 111 and a surrounding p-type well region corresponds to the photoelectric conversion unit 11. When incident light is irradiated, photoelectric conversion occurs in the n-type semiconductor region 111. Among charges generated by this photoelectric conversion, electrons are accumulated in the n-type semiconductor region 111. Note that the n-type semiconductor region 111 is arranged on a back surface side of the semiconductor substrate 110, and performs photoelectric conversion of incident light irradiated on the back surface side. Such an imaging element 1 is referred to as a back-illuminated imaging element.

On the front surface side of the semiconductor substrate 110, n-type semiconductor regions 112 to 115 are formed. Furthermore, gate electrodes 122 to 124 are arranged on the front surface of the semiconductor substrate 110 via a gate insulating film. These constitute the MOS transistors 22 to 24 and the charge holding unit 21, and constitute the pixel circuit 20.

The n-type semiconductor region 112 is a semiconductor region constituting the charge holding unit 21. This n-type semiconductor region 112 is referred to as a floating diffusion region, and holds a charge transferred by the charge transfer unit 12. Furthermore, the n-type semiconductor region 112, the n-type semiconductor region 113, and the gate electrode 122 constitute the MOS transistor 22. The n-type semiconductor regions 112 and 113 correspond to a source and a drain of the MOS transistor 22, respectively. A well region near the gate electrode 122 between the n-type semiconductor regions 112 and 113 corresponds to a channel region of the MOS transistor 22.

Furthermore, the n-type semiconductor region 113, the n-type semiconductor region 114, and the gate electrode 123 constitute the MOS transistor 23. The n-type semiconductor regions 113 and 114 correspond to a drain and a source of the MOS transistor 23, respectively. Furthermore, the n-type semiconductor region 114, the n-type semiconductor region 115, and the gate electrode 124 constitute the MOS transistor 24. The n-type semiconductor regions 114 and 115 correspond to a drain and a source of the MOS transistor 24, respectively.

Furthermore, the charge transfer unit 12 is a MOS transistor including the n-type semiconductor region 111, the n-type semiconductor region 112, and a gate electrode 121. The n-type semiconductor regions 111 and 112 correspond to a source and a drain of the charge transfer unit 12, respectively. The gate electrode 121 is formed in a shape in which an electrode is embedded in a hole formed in the semiconductor substrate 110 via a gate insulating film, and is arranged in the vicinity of the n-type semiconductor regions 111 and 112. By applying a gate voltage to the gate electrode 121, a channel is formed in a well region near the gate electrode 121, and the n-type semiconductor regions 111 and 112 are brought into a conductive state. As a result, charges accumulated in the n-type semiconductor region 111 of the photoelectric conversion unit 11 are transferred to the n-type semiconductor region 112 that is the floating diffusion. A transistor configured to transfer charges in a direction perpendicular to the semiconductor substrate 110 in this manner is referred to as a vertical transistor. The gate insulating film can include, for example, silicon oxide ($SiO_2$), silicon nitride (SiN), or a high dielectric film. The gate electrode 121 can include, for example, metal or polysilicon.

The wiring region 130 is a region that is arranged adjacent to the front surface side of the semiconductor substrate 110 and in which wiring of an element formed in the semiconductor substrate 110 is formed. In the wiring region 130, an insulating layer 131 and a wiring layer 132 are arranged. The wiring layer 132 is wiring including metal such as copper (Cu) and configured to transmit a signal to an element or the like formed in the semiconductor substrate 110. The insulating layer 131 insulates the wiring layer 132. This insulating layer 131 can include, for example, $SiO_2$. Furthermore, the insulating layer 131 and the wiring layer 132 can be configured in multiple layers. Note that, in the figure, the insulating layer 131 between the gate electrodes 122 to 124 and the semiconductor substrate 110 is referred to as a gate oxide film. Furthermore, between the wiring layer 132, and the semiconductor region, the gate electrode 122, and the like is connected by a contact plug 133.

The fixed charge film 141 is formed at an interface on the back surface side of the semiconductor substrate 110, to pin an interface state of the semiconductor substrate 110. This fixed charge film 141 includes a material having a negative fixed charge, and accumulates holes in the vicinity of the interface of the semiconductor substrate 110. The interface state is pinned by this accumulated holes. As a result, an influence of a dark current caused by the interface state can be reduced.

The separation unit 142 is arranged in a wall shape surrounding the semiconductor substrate 110 of the pixel 100, to separate the semiconductor substrate 110. Furthermore, the separation unit 142 shields incident light from an adjacent pixel 100. This separation unit 142 can be configured by arranging metal such as tungsten (W) in a groove formed in the semiconductor substrate 110. The separation unit 142 in the figure is arranged in a groove formed in the semiconductor substrate 110 via the fixed charge film 141.

The light shielding film 143 is arranged on the back surface side of the semiconductor substrate 110 to shield incident light. This light shielding film is arranged at a boundary of the pixels 100 and shields light transmitted through the color filter 150 of an adjacent pixel 100. As a result, an occurrence of color mixing can be prevented. Similarly to the separation unit 142, the light shielding film 143 can include metal such as W.

The color filter 150 is an optical filter that transmits light of a predetermined wavelength in incident light. As this color filter 150, for example, each color filter 150 that transmits red light, green light, and blue light can be arranged in the pixel 100. Furthermore, a color filter 150 that transmits infrared light can also be arranged in the pixel 100.

The planarization film 144 is a film to planarize the back surface side of the pixel 100 in which the color filter 150 is formed. This planarization film 144 can include a coating-type insulating material.

The on-chip lens 181 is a lens that collects incident light. This on-chip lens 181 is formed in a hemispherical shape, and collects incident light on the photoelectric conversion unit 11 (n-type semiconductor region 111) of the semiconductor substrate 110. The on-chip lens 181 in the figure collects incident light via the color filter 150. The on-chip lens 181 can include, for example, an organic material having a refractive index of 1.0 to 1.3. Note that the on-chip lens 181 is an example of an individual on-chip lens described in the claims.

Note that, in the phase difference pixel 200, a common on-chip lens 182 to be described later is arranged instead of the on-chip lens 181. Other configurations of the phase difference pixel 200 can be made similar to the configurations of the pixel 100.

[Configuration of Pixel Array Unit]

Figure 4:
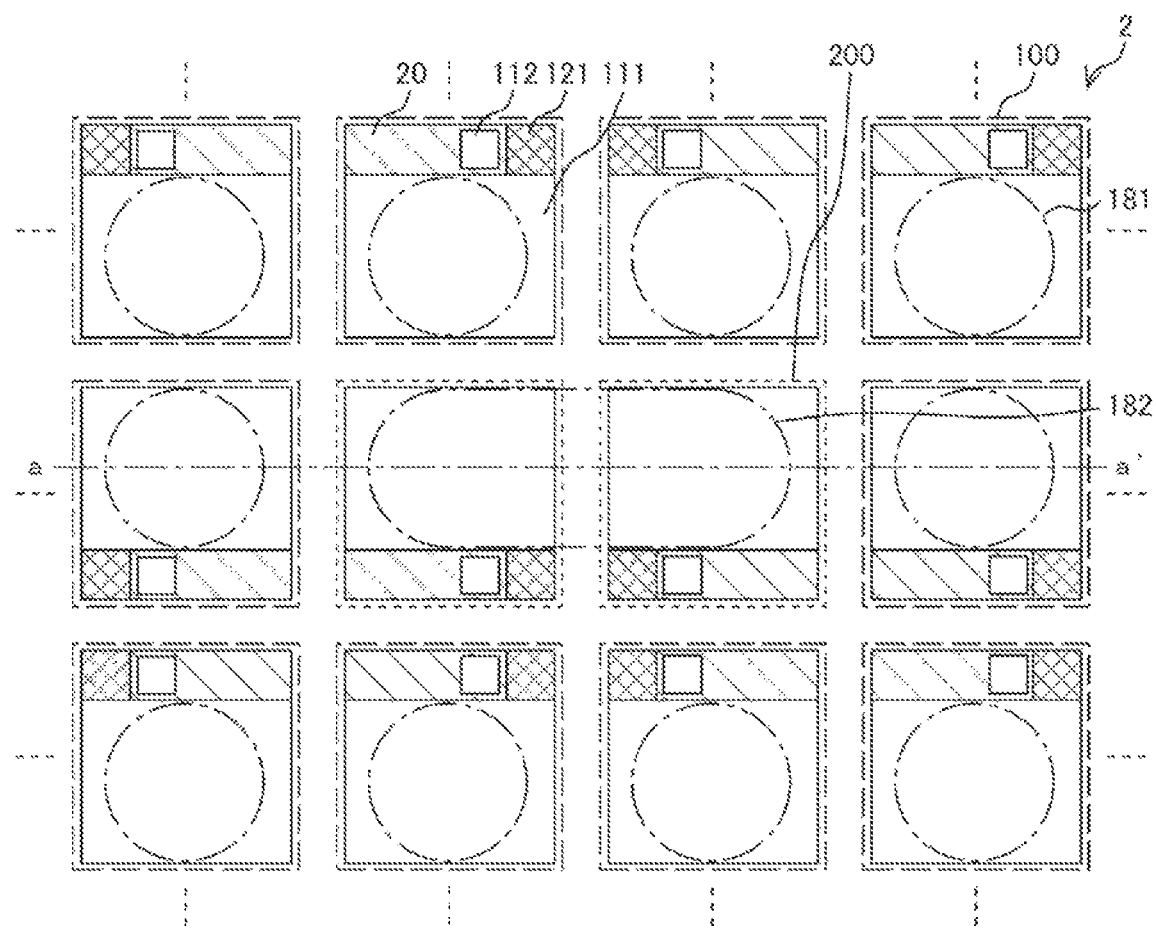
FIG. 4 is a view illustrating a configuration example of a pixel array unit according to the first embodiment of the present disclosure.

FIG. 4 is a view illustrating a configuration example of a pixel array unit according to the first embodiment of the present disclosure. The figure is a plan view illustrating a configuration example of the pixel 100 and the phase difference pixel 200 in the pixel array unit 2. A rectangle of a dotted line in the figure represents the pixel 100, and a rectangle of a dashed line represents the phase difference pixel 200. Furthermore, in the pixel 100 and the phase difference pixel 200, a rectangle hatched with oblique lines represents a region of the pixel circuit 20. A rectangle in this pixel circuit 20 represents the n-type semiconductor region 112 of the charge holding unit 21. Furthermore, a rectangle with meshed hatching represents the gate electrode 121 of the vertical transistor. A rectangle adjacent to the pixel circuit 20 and the gate electrode 121 represents the n-type semiconductor region 111 of the photoelectric conversion unit 11. The gate electrode 121 of the charge transfer unit 12 is arranged at a corner portion of the pixel 100 or the like, and the n-type semiconductor region 111 and the pixel circuit 20 are individually arranged to be adjacent.

A circle of a one dotted chain line in the pixel 100 represents the on-chip lens 181. Furthermore, an oval of a one dotted chain line of the phase difference pixel 200 represents the common on-chip lens 182. As illustrated in the figure, the on-chip lens 181 is arranged for each pixel 100, and the common on-chip lens 182 is arranged in common for two adjacent phase difference pixels 200. Note that a shape of the common on-chip lens 182 is not limited to this example. For example, the common on-chip lens 182 can also be formed in an elliptical shape. The two adjacent phase difference pixels 200 in the figure perform pupil split in adjacent directions. In the pixel array unit 2 in the figure, pupil split is performed laterally on the subject.

A charge of the n-type semiconductor region 111 of the photoelectric conversion unit 11 is transferred by the charge transfer unit 12 configured as a vertical transistor, in a direction changed by 90 degrees in plan view. This charge transfer unit 12 is arranged in a region not overlapping with the common on-chip lens 182 in the phase difference pixel 200. That is, the charge transfer unit 12 including the vertical transistor having the gate electrode 121 not contributing to photoelectric conversion is arranged in a region between the common on-chip lens 182 and the on-chip lens 181 on a surface irradiated with incident light. As a result, it is possible to remove an influence of the charge transfer unit 12 on collection of incident light by the common on-chip lens 182 in the phase difference pixel 200. This is because the gate electrode 121 of the charge transfer unit 12 does not shield an optical path of incident light collected by the common on-chip lens 182.

[Configuration of Phase Difference Pixel]

Figure 5:
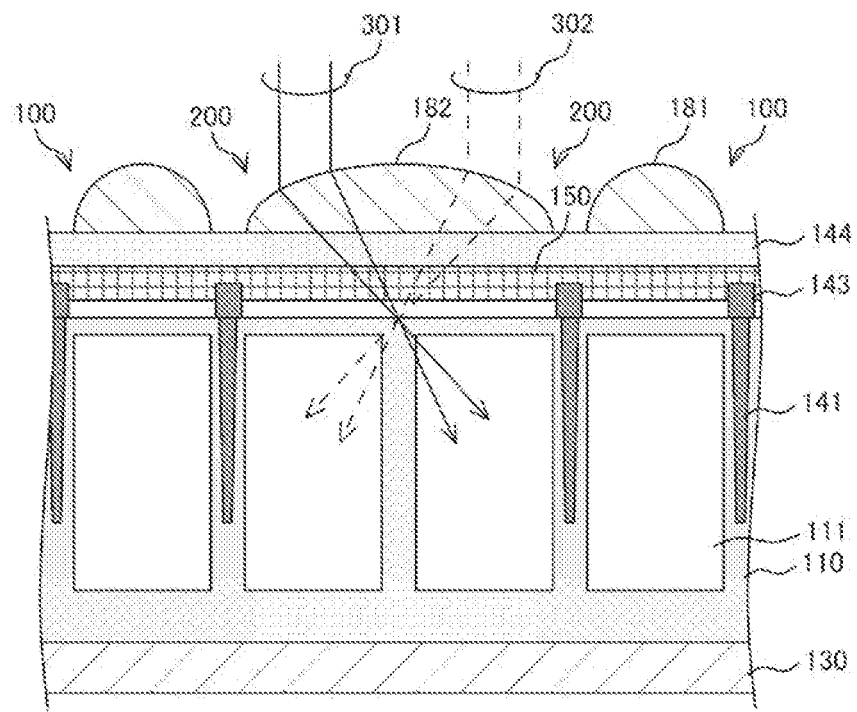
FIG. 5 is a cross-sectional view illustrating a configuration example of a phase difference pixel according to the first embodiment of the present disclosure.

FIG. 5 is a cross-sectional view illustrating a configuration example of a phase difference pixel according to the first embodiment of the present disclosure. The figure is a cross-sectional view illustrating a configuration example of the phase difference pixel 200, and is a cross-sectional view taken along line a-a' in FIG. 4.

As described above, the common on-chip lens 182 is arranged as a common on-chip lens of two phase difference pixels 200. Furthermore, the common on-chip lens 182 forms a focal point between the two phase difference pixels 200 in the vicinity of the back surface of the semiconductor substrate 110. As a result, incident light from a subject that has passed through the left side of the imaging lens enters the photoelectric conversion unit 11 (n-type semiconductor region 111) of the right-side phase difference pixel 200, and incident light that has passed through the right side of the imaging lens enters the photoelectric conversion unit 11 of the left-side phase difference pixel 200. A solid arrow in the figure represents incident light 301 that has passed through the left side of the imaging lens, and a dotted arrow represents incident light 302 that has passed through the right side of the imaging lens. In this manner, by arranging the common on-chip lens 182 in the two adjacent phase difference pixels 200, pupil split can be performed, and a phase difference can be detected.

Note that light from a subject that has passed through a focal point between the two phase difference pixels 200 in the vicinity of the back surface of the semiconductor substrate 110 enters the n-type semiconductor region 111 and is photoelectrically converted. When a structure not contributing to photoelectric conversion, such as the gate electrode 121 of the charge transfer unit 12, is arranged in the vicinity of the n-type semiconductor region 111 where the incident light reaches, photoelectric conversion of the incident light is hindered. Furthermore, when such a structure is arranged asymmetrically in the two phase difference pixels 200, a difference occurs in sensitivity between the two phase difference pixels 200, and a difference occurs in image signal output. Since a difference in image signals is generated, which is not caused by a phase difference of incident light, an error in phase difference detection occurs.

Even in a case where the structure not contributing to photoelectric conversion is arranged in the vicinity of the photoelectric conversion unit 11, it is considered that a difference between image signals is not generated, by configuring the two phase difference pixels 200 to be completely symmetric. However, it is difficult to completely symmetrically make the configuration of the two phase difference pixels 200. Furthermore, in the phase difference pixel 200 arranged in a peripheral edge portion of the pixel array unit 2, an image height increases, and the incident light obliquely enters the phase difference pixel 200. Therefore, an influence of the structure not contributing to photoelectric conversion increases. Therefore, as described above in FIG. 4, the charge transfer unit 12 having the gate electrode 121, which is a structure not contributing to photoelectric conversion, is arranged in a region different from a region where the common on-chip lens 182 is arranged. As a result, an output difference of image signals of the two phase difference pixels 200 can be reduced. Also in this case, by symmetrically configuring the two phase difference pixels 200, the output difference of the image signals of the two phase difference pixels 200 can be further reduced.

As described above, the imaging element 1 according to the first embodiment of the present disclosure includes the two phase difference pixels 200 in which the common on-chip lens 182 is arranged. In the imaging element 1 according to the first embodiment of the present disclosure, the charge transfer unit 12 having the gate electrode 121, which is a structure not contributing to photoelectric conversion, is arranged between the common on-chip lens 182 and the on-chip lens 181 of the pixel 100. As a result, a difference in image signals of the phase difference pixels 200 can be reduced, and an error in phase difference detection of the phase difference pixels 200 can be reduced.

2. Second Embodiment

In the imaging element 1 of the first embodiment described above, two phase difference pixels 200 have been arranged adjacent to each other. On the other hand, an imaging element 1 according to a second embodiment of the present disclosure is different from the above-described first embodiment in that a separation unit is arranged between two adjacent phase difference pixels 200 in a semiconductor substrate 110.

[Configuration of Phase Difference Pixel]

Figure 6:
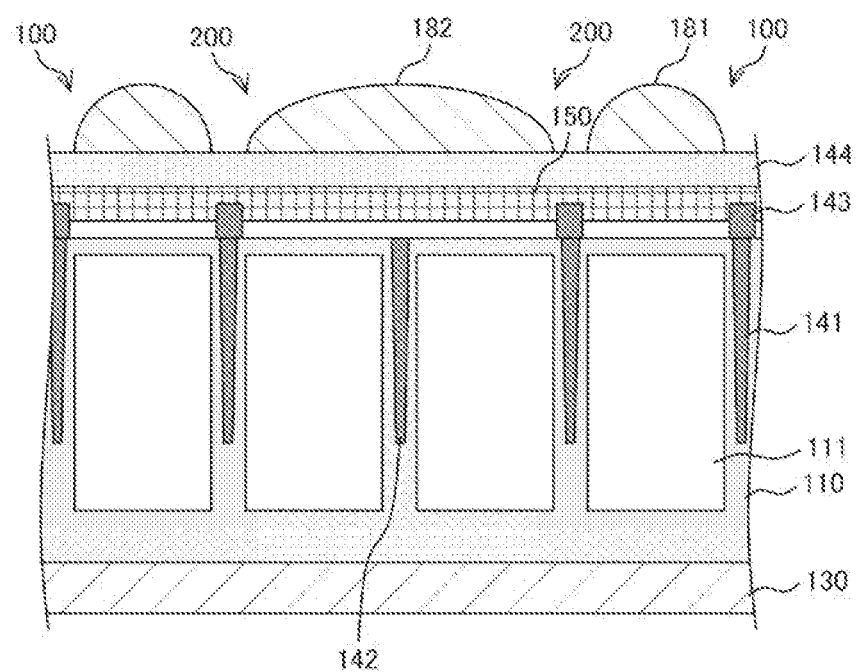
FIG. 6 is a cross-sectional view illustrating a configuration example of a phase difference pixel according to a second embodiment of the present disclosure.

FIG. 6 is a cross-sectional view illustrating a configuration example of a phase difference pixel according to the second embodiment of the present disclosure. The figure is, similarly to FIG. 5, a cross-sectional view illustrating a configuration example of the phase difference pixel 200. There is a difference from the phase difference pixel 200 described in FIG. 5 in that a separation unit 142 is arranged between the two phase difference pixels 200 in the semiconductor substrate 110.

In the phase difference pixel 200 in the figure, the separation unit 142 is arranged in a well region between individual n-type semiconductor regions 111 of the semiconductor substrate 110. Therefore, leakage of incident light and leakage of charges from the adjacent phase difference pixels 200 can be reduced.

Since a configuration of the imaging element 1 other than this is similar to the configuration of the imaging element 1 described in the first embodiment of the present disclosure, the description thereof will be omitted.

As described above, in the imaging element 1 according to the second embodiment of the present disclosure, by arranging the separation unit 142 between the two phase difference pixels 200 in the semiconductor substrate 110, leakage of incident light or the like can be reduced, and an occurrence of a difference in image signals can be reduced. An error of the phase difference detection can be further reduced.

3. Third Embodiment

In the imaging element 1 of the first embodiment described above, the pixel circuit 20 has been arranged for each of the pixel 100 and the phase difference pixel 200. On the other hand, an imaging element 1 according to a third embodiment of the present disclosure is different from the above-described first embodiment in that a pixel circuit 20 is shared by a plurality of pixels 100 and the like.

[Circuit Configuration of Pixel]

Figure 7:
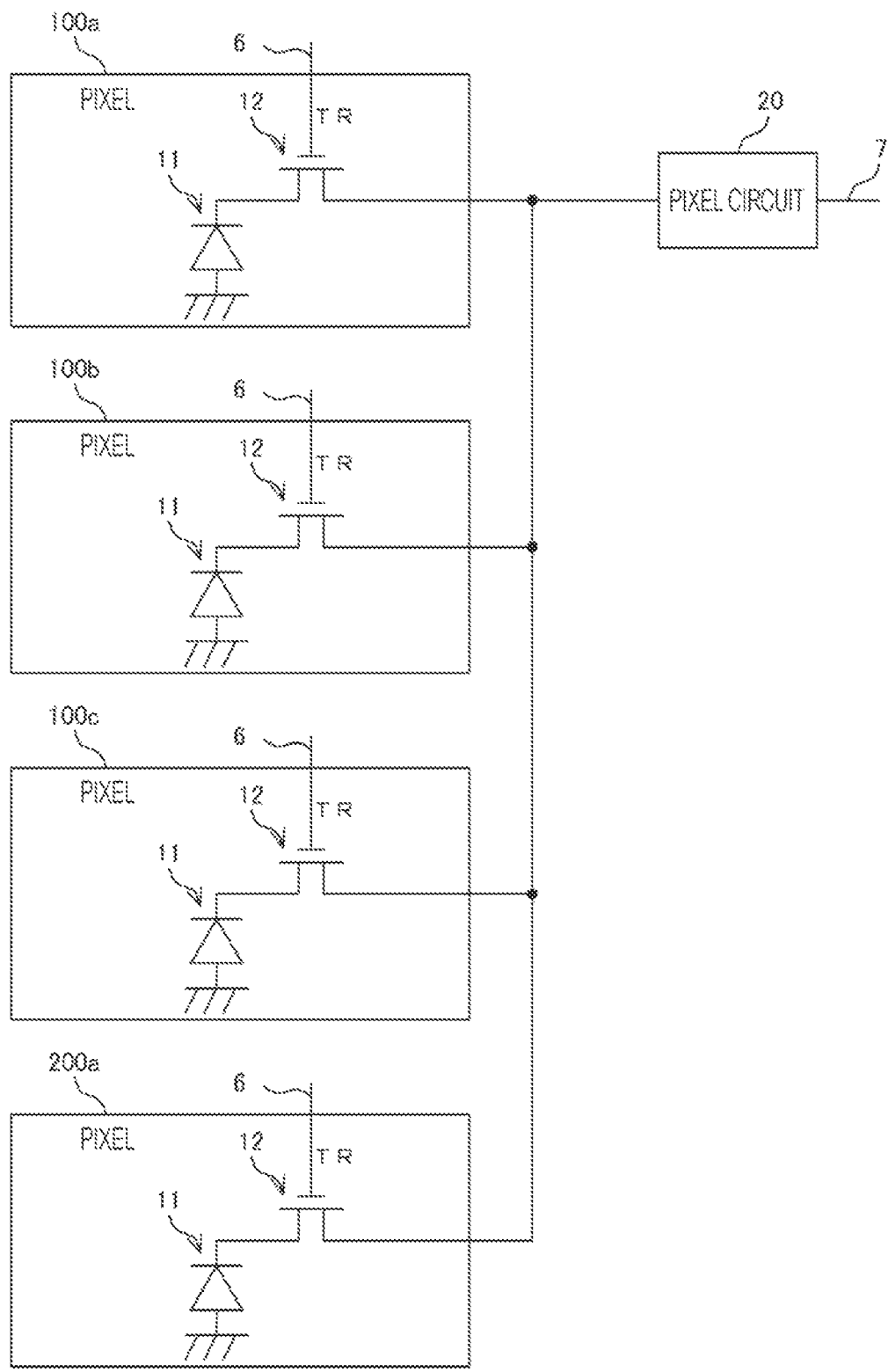
FIG. 7 is a circuit diagram illustrating a configuration example of a pixel according to a third embodiment of the present disclosure.

FIG. 7 is a circuit diagram illustrating a configuration example of a pixel according to the third embodiment of the present disclosure. A pixel 100 and a phase difference pixel 200 in the figure are different from the pixel 100 and the phase difference pixel 200 described in FIG. 2 in that the pixel circuit 20 is shared by a plurality of pixels 100 and the like. A circuit configuration will be described using the pixel 100 as an example. The pixel 100 in the figure includes a photoelectric conversion unit 11 and a charge transfer unit 12, and the pixel circuit 20 is arranged separately. The figure represents an example of a configuration in which the pixel circuit 20 is connected in common to four pixels 100 and the like (pixels 100a, 100b, and 100c, and a phase difference pixel 200a).

Drains of the charge transfer units 12 of the pixels 100a, 100b, and 100c and the phase difference pixel 200a are connected in common to a charge holding unit 21 of the pixel circuit 20.

By sequentially inputting an ON signal to TR of each of the pixels 100a, 100b, and 100c and the phase difference pixel 200a, charges generated by the photoelectric conversion unit 11 of the pixel 100a and the like and are sequentially transferred to the pixel circuit 20. On the basis of these transferred charges, image signals can be sequentially generated.

[Configuration of Pixel]

Figure 8:
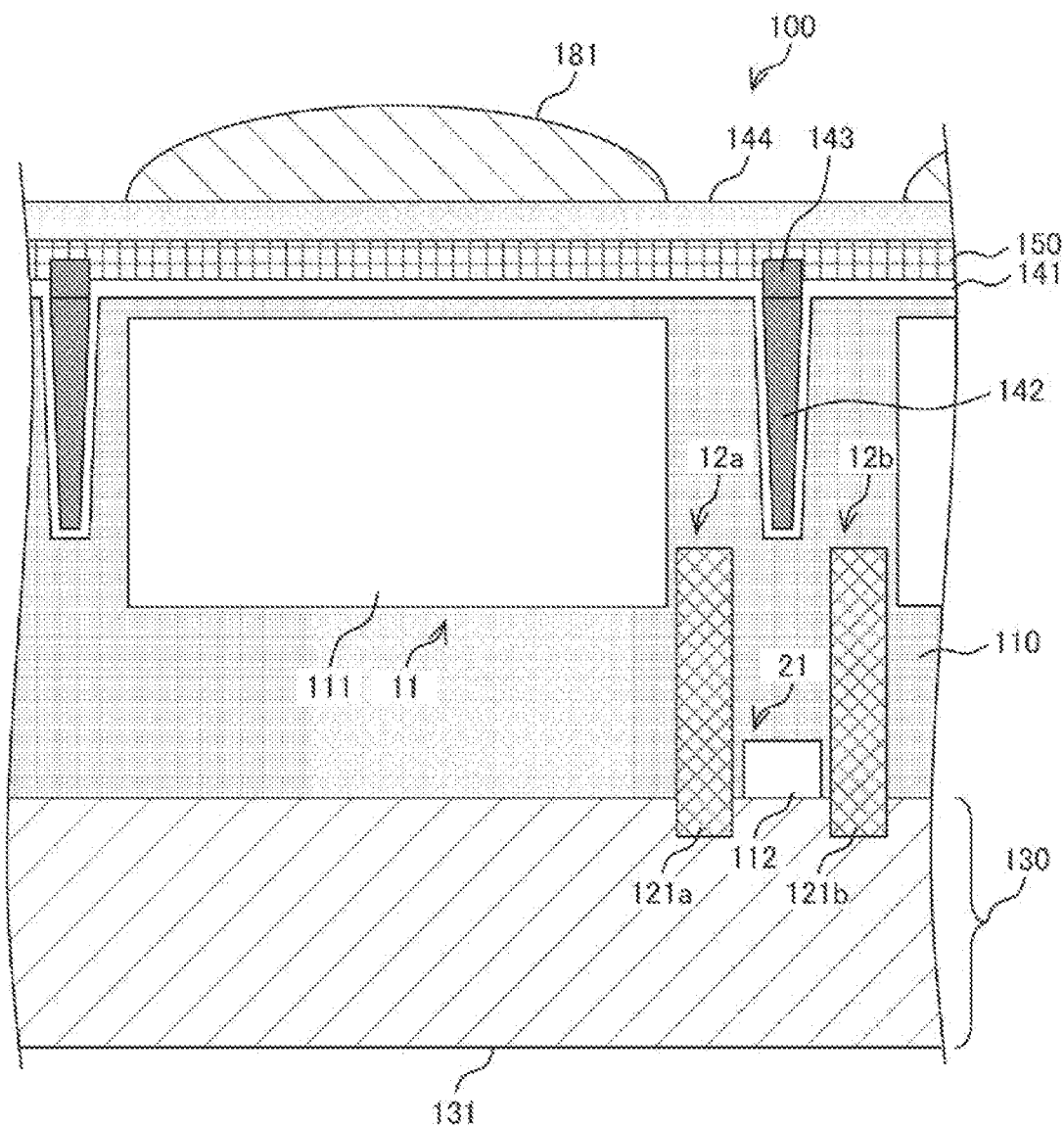
FIG. 8 is a cross-sectional view illustrating a configuration example of the pixel according to the third embodiment of the present disclosure.

FIG. 8 is a cross-sectional view illustrating a configuration example of a pixel according to the third embodiment of the present disclosure. The figure is, similarly to FIG. 3, a schematic cross-sectional view illustrating a configuration example of the pixel 100. Note that, in the figure, characters "a" and "b" attached to reference numerals correspond to the different pixels 100 (pixels 100a and 100b) illustrated in FIG. 7. The pixel 100 in the figure is different from the pixel 100 described in FIG. 3 in the following points. The charge holding unit 21 is arranged between the pixels 100 and the like. Furthermore, a plurality of charge transfer units 12 (charge transfer units 12a and 12b) is connected in common to the charge holding unit 21. That is, respective gate electrodes 121a and 121b of the charge transfer units 12a and 12b are arranged close to an n-type semiconductor region 112 of the charge holding unit 21. The n-type semiconductor region 112 of the charge holding unit 21 constitutes a common drain region of the charge transfer units 12a and 12b. Note that description of the pixel circuit 20 other than the charge holding unit 21 has been omitted.

[Configuration of Pixel Array Unit]

Figure 9:
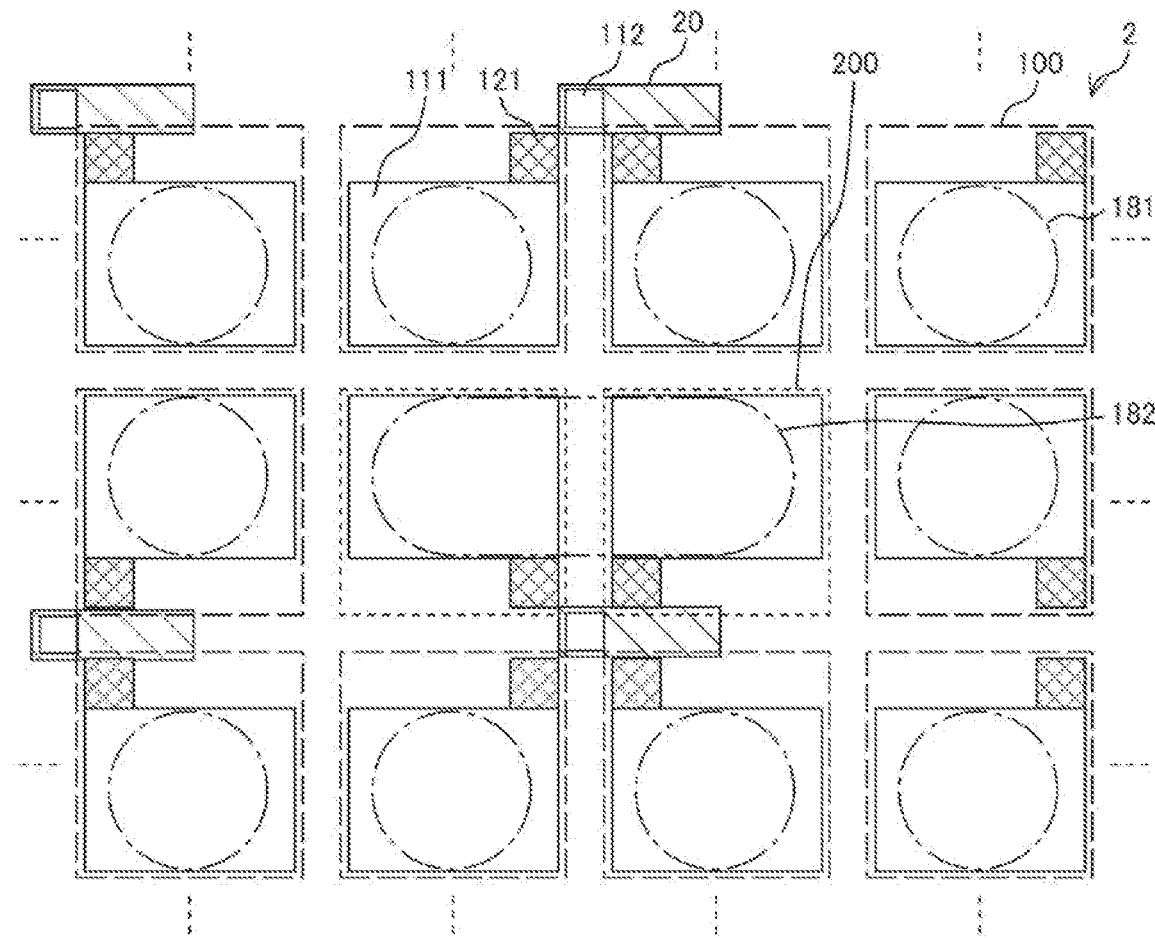
FIG. 9 is a view illustrating a configuration example of a pixel array unit according to the third embodiment of the present disclosure.

FIG. 9 is a view illustrating a configuration example of a pixel array unit according to the third embodiment of the present disclosure. The figure is, similarly to FIG. 4, a plan view illustrating a configuration example of the pixel 100 and the phase difference pixel 200 in a pixel array unit 2. There is a difference from the pixel array unit 2 described in FIG. 4 in that the pixel circuit 20 is arranged in an outer region of the pixel 100 and the like, and is arranged in common for each of the plurality of pixels 100.

The pixel circuit 20 is arranged in common for the pixels 100 and the like in adjacent two rows and two columns. The n-type semiconductor region 112 of the charge holding unit 21 of the pixel circuit 20 is arranged in a central portion of these four pixels 100 and the like. These gate electrodes 121 of the four pixels 100 and the like are arranged close to the n-type semiconductor region 112 of the charge holding unit 21.

Also in the figure, the gate electrode 121 is arranged between a common on-chip lens 182 and an on-chip lens 181. As a result, an output difference of image signals of the two phase difference pixels 200 can be reduced.

Since a configuration of the imaging element 1 other than this is similar to the configuration of the imaging element 1 described in the first embodiment of the present disclosure, the description thereof will be omitted.

As described above, in the imaging element 1 according to the third embodiment of the present disclosure, the pixel circuit 20 is shared by the plurality of pixels 100 and the like. As a result, the configuration of the pixel 100 and the like can be simplified.

4. Fourth Embodiment

In the imaging element 1 of the third embodiment described above, the photoelectric conversion unit 11 has been arranged in the semiconductor substrate 110 of the pixel 100 and the phase difference pixel 200. On the other hand, an imaging element 1 according to a fourth embodiment of the present disclosure is different from the above-described first embodiment in that a photoelectric conversion film configured to perform photoelectric conversion is further arranged.

[Circuit Configuration of Pixel]

Figure 10:
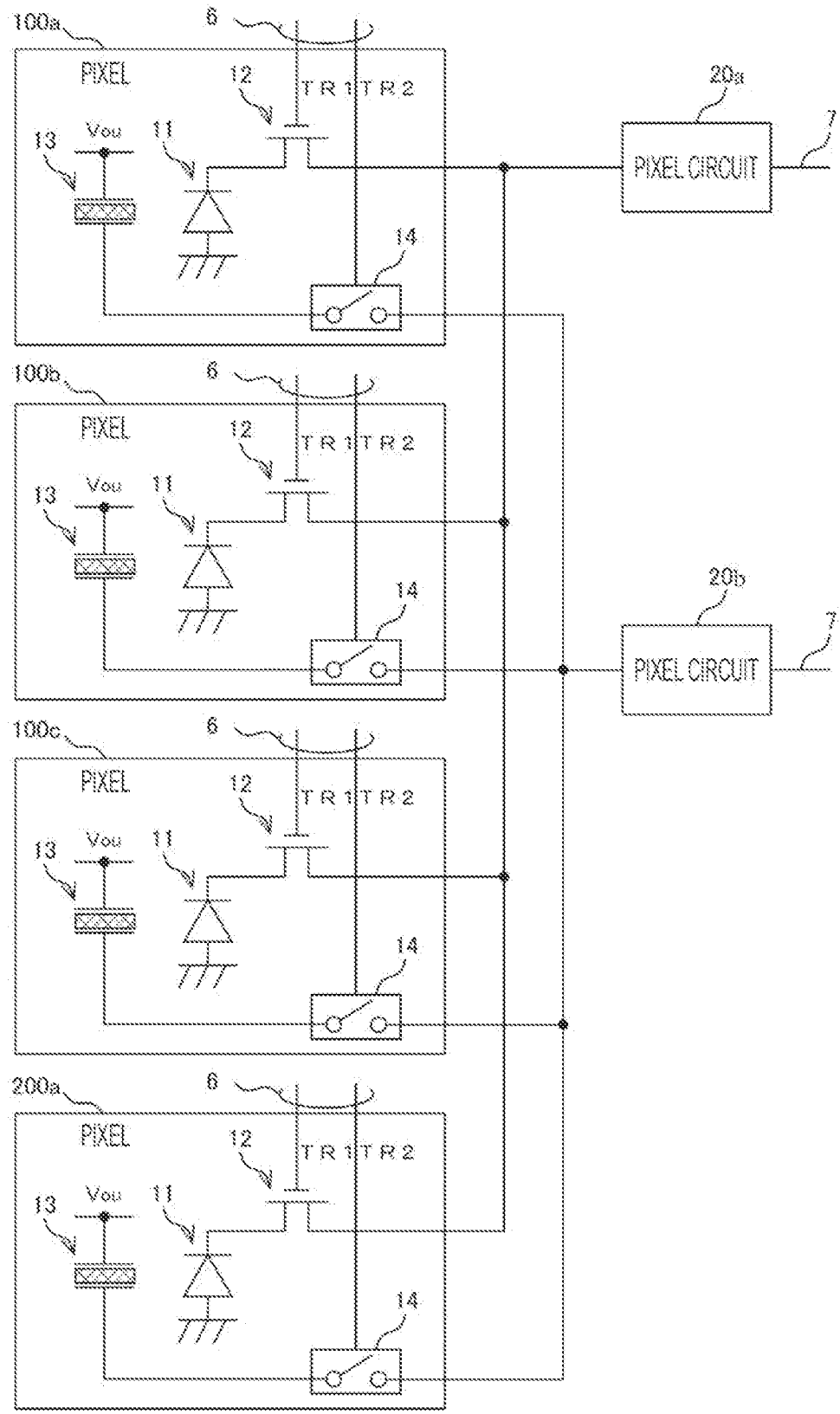
FIG. 10 is a circuit diagram illustrating a configuration example of a pixel according to a fourth embodiment of the present disclosure.

FIG. 10 is a circuit diagram illustrating a configuration example of a pixel according to the fourth embodiment of the present disclosure. A pixel 100 and a phase difference pixel 200 in the figure are different from the pixel 100 and the phase difference pixel 200 described in FIG. 7 in that a photoelectric conversion unit is further arranged and a plurality of pixel circuits 20 is shared by a plurality of pixels 100 and the like. A circuit configuration will be described using the pixel 100 as an example. The pixel 100 in the figure further includes a photoelectric conversion unit 13 and a switch element 14, and the plurality of pixel circuits 20 is arranged. The figure represents an example of a configuration in which two pixel circuits 20 (pixel circuits 20a and 20b) are connected in common to four pixels 100 and the like (pixels 100a, 100b, and 100c, and a phase difference pixel 200a).

The photoelectric conversion unit 13 is a photoelectric conversion unit configured by sandwiching a photoelectric conversion film between a first electrode and a second electrode. In the figure, the photoelectric conversion unit 13 is configured as a two-terminal element, and generates a charge based on photoelectric conversion. Furthermore, similarly to a charge transfer unit 12, the switch element 14 is an element configured to transfer the charge generated by the photoelectric conversion unit 13. The switch element 14 is configured as a three-terminal element, and includes an input terminal, an output terminal, and a control signal terminal. Similarly to a MOS transistor of the charge transfer unit 12, when a control signal is inputted to the control signal terminal, the input terminal and the output terminal are brought into a conductive state. As described later, the photoelectric conversion unit 13 and the switch element 14 are integrally configured in the pixel 100 and the like. In the figure, the photoelectric conversion unit 13 and the switch element 14 are individually illustrated for convenience. Furthermore, a power supply line Vou is further arranged in the pixel 100 and the like in the figure. This power supply line Vou is a power supply line that supplies a bias voltage to the photoelectric conversion unit 13. Furthermore, a signal line 6 further includes a signal line TR2 that transmits a control signal to a control signal terminal of the switch element 14. Accordingly, for distinction, a signal line for transmitting a control signal to a gate of the charge transfer unit 12 is changed to a signal line TR1.

Drains of the charge transfer units 12 of the pixels 100a, 100b, and 100c and the phase difference pixel 200a are connected in common to a charge holding unit 21 of the pixel circuit 20a. Furthermore, one end of the photoelectric conversion unit 13 is connected to the power supply line Vou, and another end is connected to the input terminal of the switch element 14. The control signal terminal of the switch element 14 is connected to the signal line TR2. The output terminals of the switch elements 14 of the pixels 100a, 100b, and 100c and the phase difference pixel 200a are connected in common to the charge holding unit 21 of the pixel circuit 20b.

By sequentially inputting an ON signal to TR1 of each of the pixels 100a, 100b, and 100c and the phase difference pixel 200a, charges generated by photoelectric conversion units 11 of the pixel 100a and the like are sequentially transferred to the pixel circuit 20a, and an image signal is generated. Similarly, by sequentially inputting a control signal to TR2 of each of the pixels 100a, 100b, and 100c and the phase difference pixel 200a, charges generated by the photoelectric conversion units 13 of the pixel 100a and the like are sequentially transferred to the pixel circuit 20b, and an image signal is generated.

[Configuration of Pixel]

Figure 11:
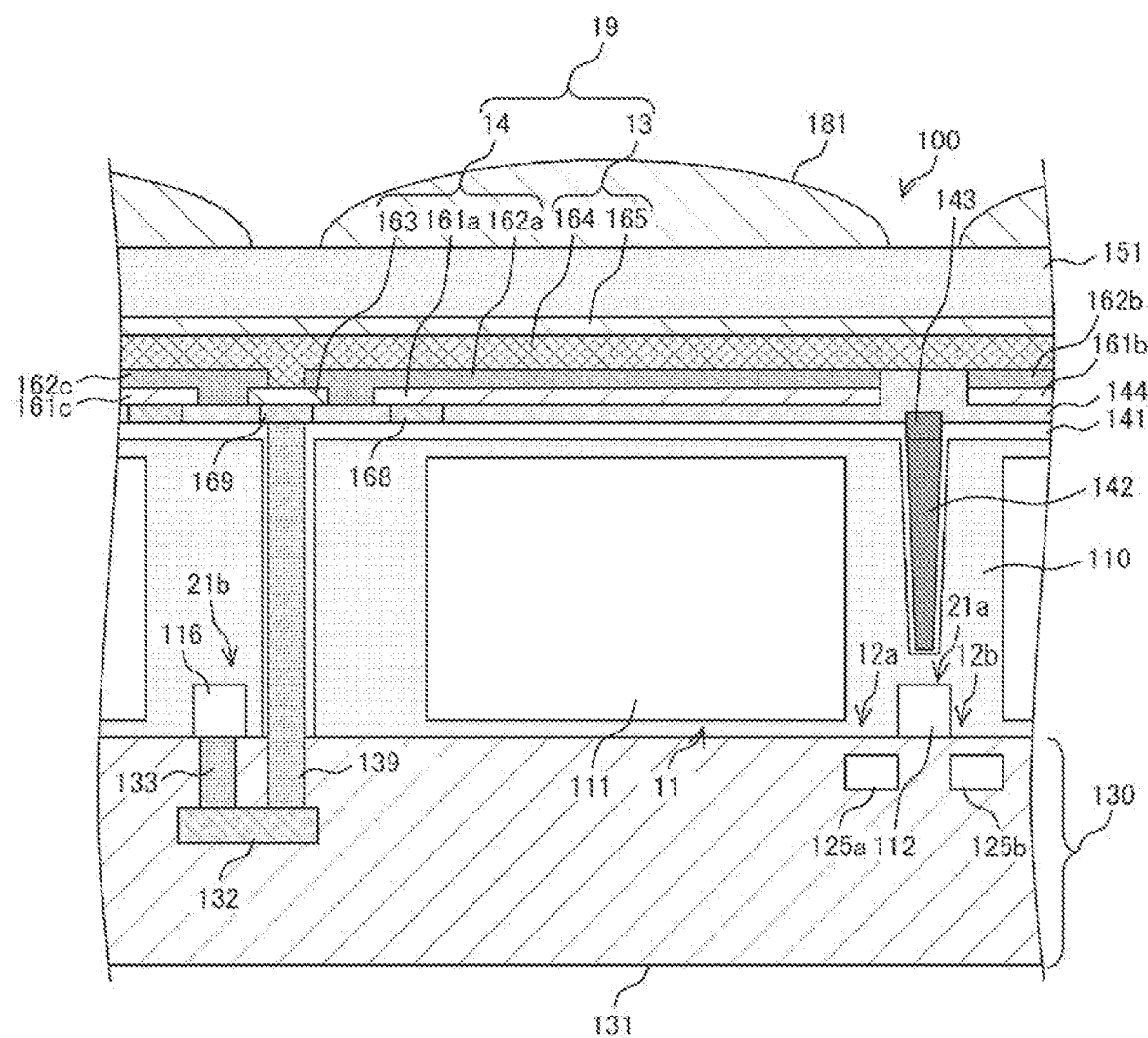
FIG. 11 is a cross-sectional view illustrating a configuration example of the pixel according to the fourth embodiment of the present disclosure.

FIG. 11 is a cross-sectional view illustrating a configuration example of a pixel according to the fourth embodiment of the present disclosure. The figure is, similarly to FIG. 8, a schematic cross-sectional view illustrating a configuration example of the pixel 100. Note that, in the figure, characters "a", "b", and "c" attached to reference numerals correspond to the different pixels 100 (pixels 100a, 100b, and 100c) illustrated in FIG. 10. The pixel 100 in the figure is different from the pixel 100 described in FIG. 8 in the following points. The charge transfer unit 12 includes a MOS transistor. Furthermore, a plurality of charge transfer units 12 (charge transfer units 12a and 12b) is connected in common to a charge holding unit 21a. That is, an n-type semiconductor region 112 of the charge holding unit 21a constitutes a common drain region of the charge transfer units 12a and 12b. Gate electrodes 125a and 125b in the figure correspond to gates of these charge transfer units 12. The charge holding unit 21a corresponds to the charge holding unit 21 of the pixel circuit 20a described in FIG. 10. Furthermore, a photoelectric conversion unit 19 is further provided, and a through electrode 139 configured to transfer a charge generated by the photoelectric conversion unit 19 is further provided. Furthermore, a high refractive index film 151 is arranged between the photoelectric conversion unit 19 and an on-chip lens 181.

The photoelectric conversion unit 19 is arranged adjacent to a back surface side of a semiconductor substrate 110. Specifically, the photoelectric conversion unit 19 is arranged in a region of a planarization film 144. This photoelectric conversion unit 19 includes a first electrode 163, an insulating film 162, a photoelectric conversion film 164, a second electrode 165, and a charge accumulation electrode 161. The photoelectric conversion unit 19 is formed by stacking the charge accumulation electrode 161, the insulating film 162, the photoelectric conversion film 164, and the second electrode 165. The first electrode 163, the photoelectric conversion film 164, and the second electrode 165 are arranged in common for the plurality of pixels 100 and the like, and the charge accumulation electrode 161 and the insulating film 162 are individually arranged in the pixel 100 and the like. Furthermore, the first electrode 163 is connected to a central portion of the photoelectric conversion film 164 arranged in common for the plurality of pixels 100. Note that the insulating film 162 can also be arranged in common for the plurality of pixels 100 and the like.

The photoelectric conversion film 164 is a film including an organic photoelectric conversion film and configured to perform photoelectric conversion of incident light. This photoelectric conversion film 164 can include, for example, an organic photoelectric conversion material containing a rhodamine dye, a melacyanine dye, quinacridone, a phthalocyanine dye, a coumarin dye, tris-8 hydrixyquinoline Al, or the like. Furthermore, the photoelectric conversion film 164 can be configured to absorb light having a specific wavelength in incident light, to perform photoelectric conversion.

The second electrode 165 is an electrode arranged adjacent to the photoelectric conversion film 164. This second electrode 165 can include, for example, indium tin oxide (ITO). The insulating film 162 is a film that insulates between the photoelectric conversion film 164 and the charge accumulation electrode 161. This insulating film 162 can include, for example, $SiO_2$. The charge accumulation electrode 161 is an electrode that is stacked on the photoelectric conversion film 164 via the insulating film 162 and applies a voltage to the photoelectric conversion film 164. This charge accumulation electrode 161 can include, for example, ITO. The first electrode 163 is an electrode to which a charge generated by the photoelectric conversion film 164 is outputted.

Note that the second electrode 165 and the photoelectric conversion film 164 correspond to the photoelectric conversion unit 13 described in FIG. 10. The insulating film 162, the charge accumulation electrode 161, and the first electrode 163 correspond to the switch element 14 described in FIG. 10.

Furthermore, the second electrode 165 corresponds to a terminal connected to the power supply line Vou (not illustrated) described in FIG. 10. Furthermore, the first electrode 163 corresponds to the output terminal of the switch element 14 in FIG. 10. Furthermore, the charge accumulation electrode 161 corresponds to a control signal terminal of the switch element 14. Note that the charge accumulation electrode 161 and the first electrode 163 are connected to wiring 168 and 169, respectively.

A control signal having a voltage higher than a voltage of the power supply line Vou is applied to the charge accumulation electrode 161 during an exposure period of the imaging element. Then, electrons of the charges generated by photoelectric conversion of the photoelectric conversion film 164 are attracted to the charge accumulation electrode 161, and are accumulated in a region of the photoelectric conversion film 164 in the vicinity of the charge accumulation electrode 161 via the insulating film 162. Thereafter, when the charges generated by the photoelectric conversion are transferred, a control signal lower than the voltage of the power supply line Vou is applied to the charge accumulation electrode 161. As a result, the charges (electrons) accumulated in the photoelectric conversion film 164 move to the first electrode 163 and are outputted from the wiring 169.

The through electrode 139 is an electrode penetrating the semiconductor substrate 110. This through electrode 139 is an electrode configured to transfer charges from a back surface side to a front surface side of the semiconductor substrate 110. The through electrode 139 can be formed, for example, by embedding a conductive material such as metal in a through hole formed in the semiconductor substrate 110. The through electrode 139 in the figure connects the wiring 169 of the photoelectric conversion unit 19 and a wiring layer 132 arranged in a wiring region 130. The charges generated by the photoelectric conversion unit 19 described above and transferred to the first electrode 163 are transferred to the front surface side of the semiconductor substrate 110 via the through electrode 139. These transferred charges are further transferred to an n-type semiconductor region 116 via the wiring layer 132 and a contact plug 133. This n-type semiconductor region 116 constitutes a charge holding unit 21b of the pixel circuit 20b described in FIG. 10.

The high refractive index film 151 is a film having a high refractive index. The photoelectric conversion unit 19 is arranged close to the on-chip lens 181. By arranging this high refractive index film 151, a collecting position of incident light can be brought close to the photoelectric conversion unit 19. For the high refractive index film 151, for example, silicon nitride (SiN) can be used. Note that the high refractive index film 151 can be omitted.

Since the photoelectric conversion unit 19 is arranged between the on-chip lens 181 and the semiconductor substrate 110, light having a wavelength not absorbed by the photoelectric conversion unit 19 is photoelectrically converted by the photoelectric conversion unit 11 of the semiconductor substrate 110. For example, a configuration may be adopted in which the photoelectric conversion unit 19 performs photoelectric conversion of visible light, and the photoelectric conversion unit 11 performs photoelectric conversion of infrared light. Furthermore, for example, a configuration may also be adopted in which the photoelectric conversion unit 19 performs photoelectric conversion of short-wavelength visible light, and the photoelectric conversion unit 11 performs photoelectric conversion of long-wavelength visible light.

[Configuration of Pixel Array Unit]

Figure 12:
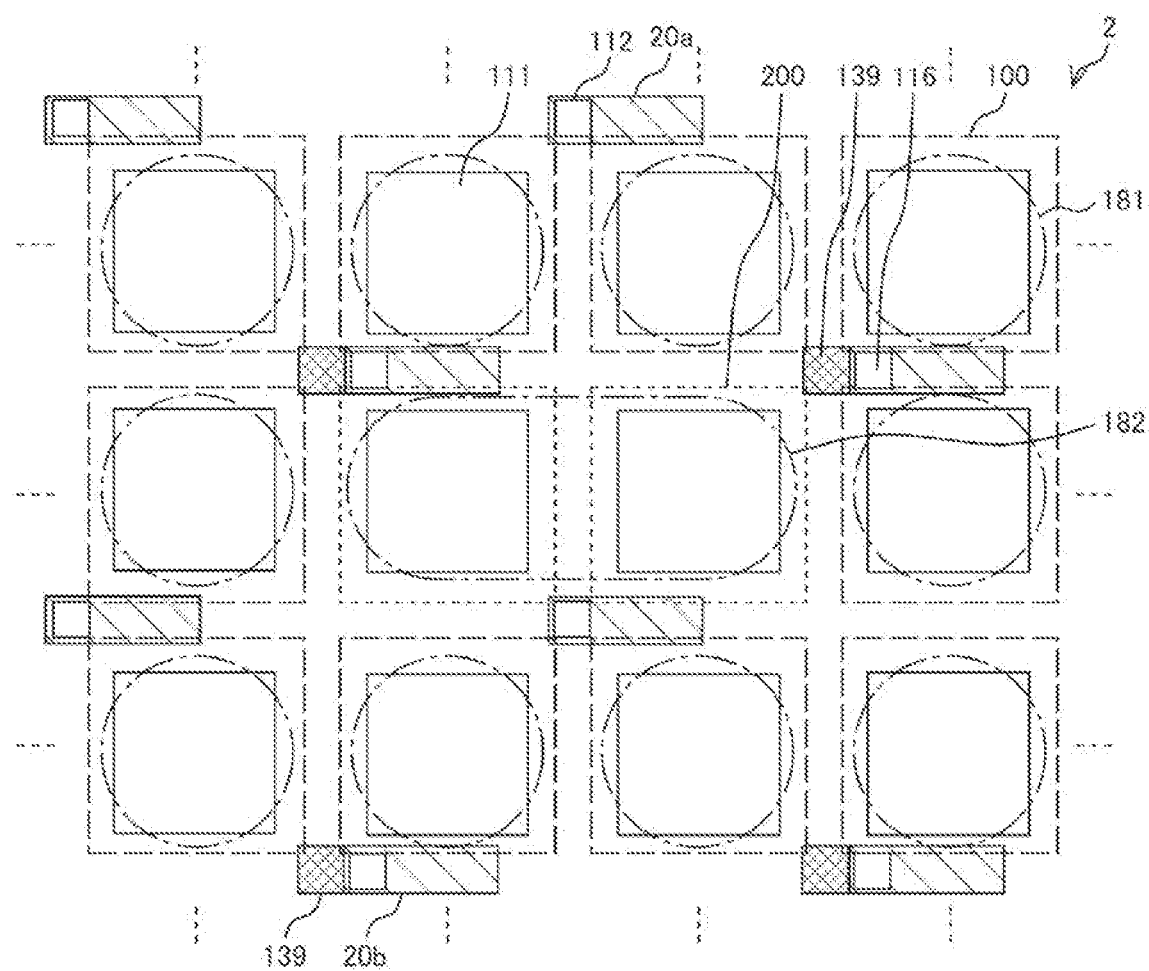
FIG. 12 is a view illustrating a configuration example of a pixel array unit according to the fourth embodiment of the present disclosure.

FIG. 12 is a view illustrating a configuration example of a pixel array unit according to the fourth embodiment of the present disclosure. The figure is, similarly to FIG. 4, a plan view illustrating a configuration example of the pixel 100 and the phase difference pixel 200 in a pixel array unit 2. There is a difference from the pixel array unit 2 described in FIG. 4 in that the pixel circuits 20a and 20b are arranged in an outer region of the pixel 100 and the like and arranged in common for each of the plurality of pixels 100, and the through electrode 139 is further arranged.

The pixel circuit 20a is arranged in common for adjacent pixels 100 and the like of two rows and two columns. The n-type semiconductor region 112 of the charge holding unit 21 of the pixel circuit 20a is arranged in a central portion of these four pixels 100 and the like. Similarly, the pixel circuit 20b is arranged in common for adjacent pixels 100 and the like of two rows and two columns. The through electrode 139 connected to the pixel circuit 20b is arranged at a central portion of the four pixels 100 and the like.

In the figure, the through electrode 139 is arranged between the common on-chip lens 182 and the on-chip lens 181. The through electrode 139 corresponds to a structure arranged in the semiconductor substrate 110 and not contributing to photoelectric conversion. By arranging this through electrode 139 in a region different from a region where the common on-chip lens 182 is arranged, it is possible to reduce an output difference of image signals of two phase difference pixels 200.

Note that the configuration of the pixel 100 and the like is not limited to this example. For example, the photoelectric conversion unit by the photoelectric conversion film may be a two-terminal type in which the charge accumulation electrode 161 is omitted. Even in this case, the through electrode 139 is arranged between the common on-chip lens 182 and the on-chip lens 181.

Since a configuration of the imaging element 1 other than this is similar to the configuration of the imaging element 1 described in the first embodiment of the present disclosure, the description thereof will be omitted.

As described above, in the imaging element 1 according to the fourth embodiment of the present disclosure, the through electrode 139, which is a structure not contributing to photoelectric conversion, is arranged between the common on-chip lens 182 and the on-chip lens 181 of the pixel 100. As a result, a difference in image signals of the phase difference pixels 200 can be reduced, and an error in phase difference detection of the phase difference pixels 200 can be reduced.

5. Fifth Embodiment

In the imaging element 1 of the above-described fourth embodiment, the photoelectric conversion unit 19 including the photoelectric conversion film has been arranged on the back surface side of the semiconductor substrate 110. On the other hand, an imaging element 1 according to a fifth embodiment of the present disclosure is different from the above-described fourth embodiment in that a color filter is arranged between an on-chip lens and a photoelectric conversion unit 19.

[Configuration of Pixel]

Figure 13:
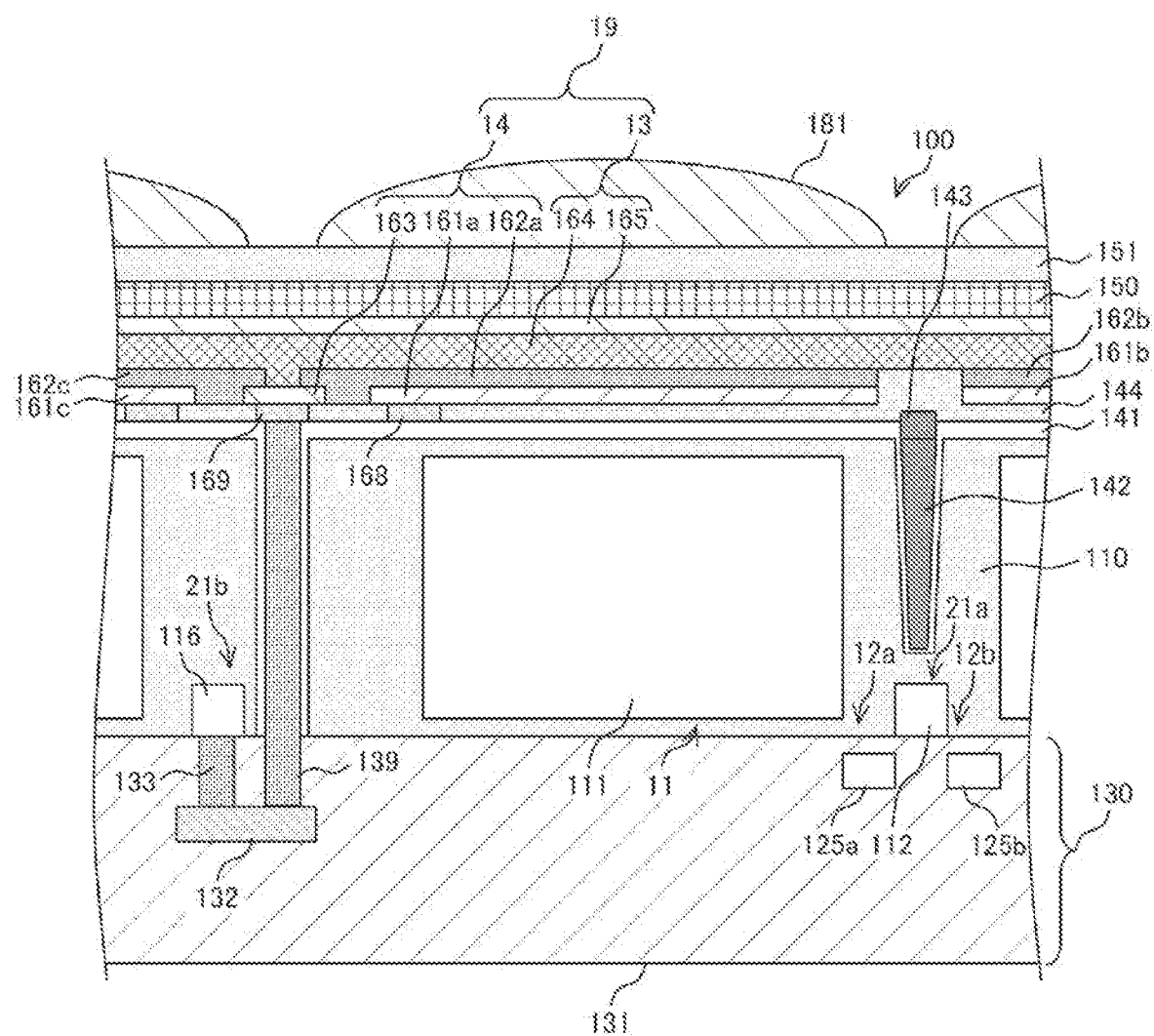
FIG. 13 is a cross-sectional view illustrating a configuration example of a pixel according to a fifth embodiment of the present disclosure.

FIG. 13 is a cross-sectional view illustrating a configuration example of a pixel according to the fifth embodiment of the present disclosure. The figure is, similarly to FIG. 11, a schematic cross-sectional view illustrating a configuration example of a pixel 100. The pixel 100 in the figure is different from the pixel 100 in FIG. 11 in that a color filter 150 is arranged between a second electrode 165 of a photoelectric conversion unit 19 and a high refractive index film 151.

As the color filter 150, for example, a color filter that shields infrared light or ultraviolet light can be used. This configuration makes it possible to reduce an error due to infrared light or the like in an imaging element configured to perform visible light imaging.

Since a configuration of the imaging element 1 other than this is similar to the configuration of the imaging element 1 described in the fourth embodiment of the present disclosure, the description thereof will be omitted.

As described above, the imaging element 1 according to the fifth embodiment of the present disclosure can reduce an error of an image signal of visible light, by arranging the color filter 150 between an on-chip lens 181 and the photoelectric conversion unit 19.

6. Sixth Embodiment

In the imaging element 1 of the fifth embodiment described above, the color filter 150 has been arranged between the on-chip lens 181 and the photoelectric conversion unit 19. On the other hand, an imaging element 1 according to a sixth embodiment of the present disclosure is different from the above-described fifth embodiment in that a color filter is arranged between a photoelectric conversion unit 19 and a semiconductor substrate 110.

[Configuration of Pixel]

Figure 14:
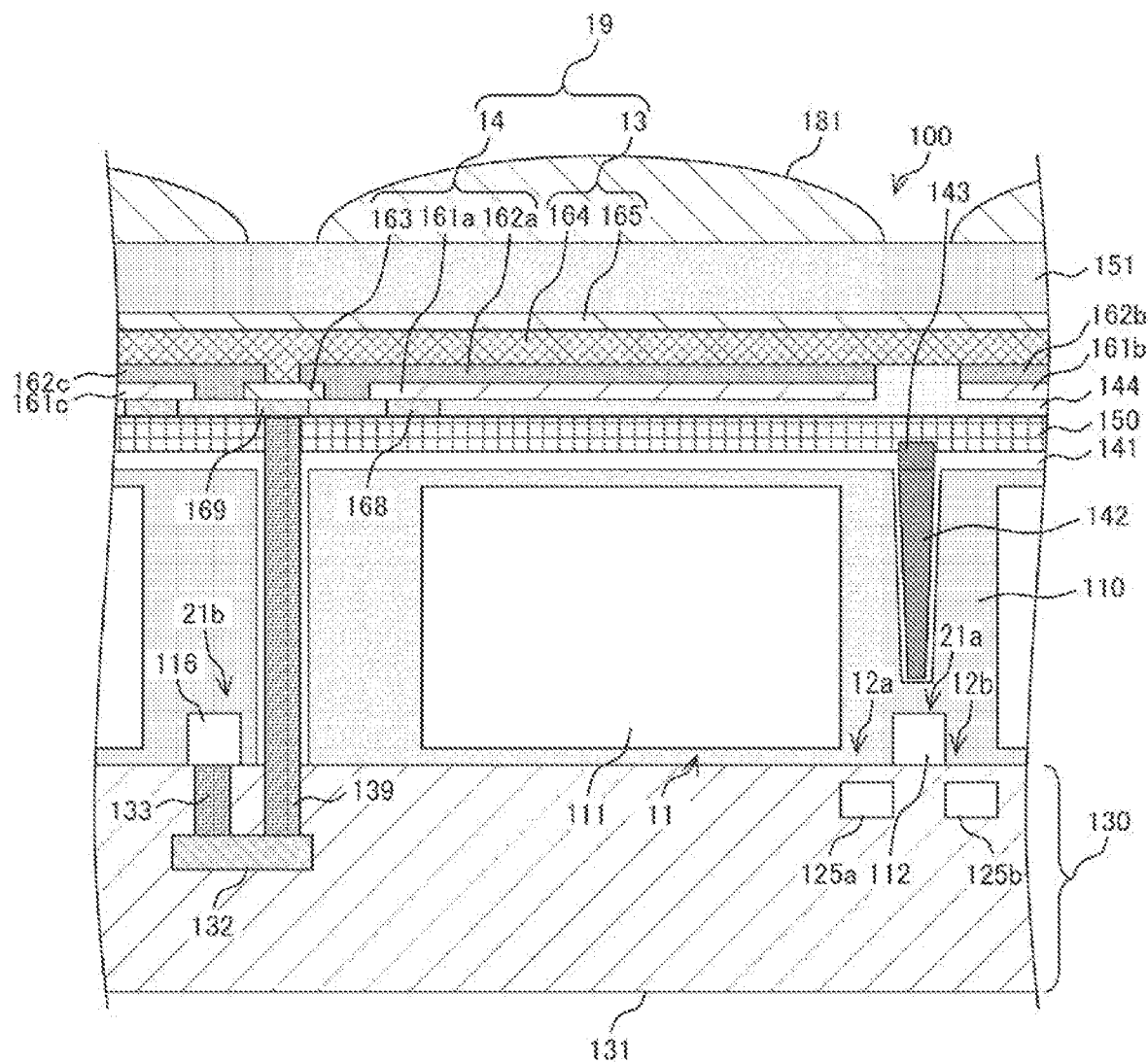
FIG. 14 is a cross-sectional view illustrating a configuration example of a pixel according to a sixth embodiment of the present disclosure.

FIG. 14 is a cross-sectional view illustrating a configuration example of a pixel according to the sixth embodiment of the present disclosure. The figure is, similarly to FIG. 13, a schematic cross-sectional view illustrating a configuration example of a pixel 100. The pixel 100 in the figure is different from the pixel 100 in FIG. 13 in that a color filter 150 is arranged between a planarization film 144 and a fixed charge film 141.

The color filter 150 in the figure is arranged between the photoelectric conversion unit 19 and the semiconductor substrate 110, and light transmitted through the photoelectric conversion unit 19 is incident on the color filter 150 in the figure. Therefore, it is possible to use a color filter that shields, in light not absorbed by the photoelectric conversion unit 19, light having a wavelength that is not a target of photoelectric conversion in the photoelectric conversion unit 11 of the semiconductor substrate 110. For example, when the photoelectric conversion unit 19 absorbs green light to perform photoelectric conversion, a color filter 150 that shields green light can be used. This configuration makes it possible to reduce an error of an image signal generated by the photoelectric conversion unit 11 of the semiconductor substrate 110.

Since a configuration of the imaging element 1 other than this is similar to the configuration of the imaging element 1 described in the fifth embodiment of the present disclosure, the description thereof will be omitted.

As described above, the imaging element 1 according to the sixth embodiment of the present disclosure can reduce an error of an image signal generated in the photoelectric conversion unit 11 of the semiconductor substrate 110, by arranging the color filter 150 between the photoelectric conversion unit 19 and the semiconductor substrate 110.

7. Seventh Embodiment

In the imaging element 1 of the above-described fourth embodiment, the photoelectric conversion unit 11 has been arranged in the semiconductor substrate 110. On the other hand, an imaging element 1 according to a seventh embodiment of the present disclosure is different from the above-described fourth embodiment in that a photoelectric conversion unit arranged on a semiconductor substrate 110 is further provided.

[Circuit Configuration of Pixel]

Figure 15:
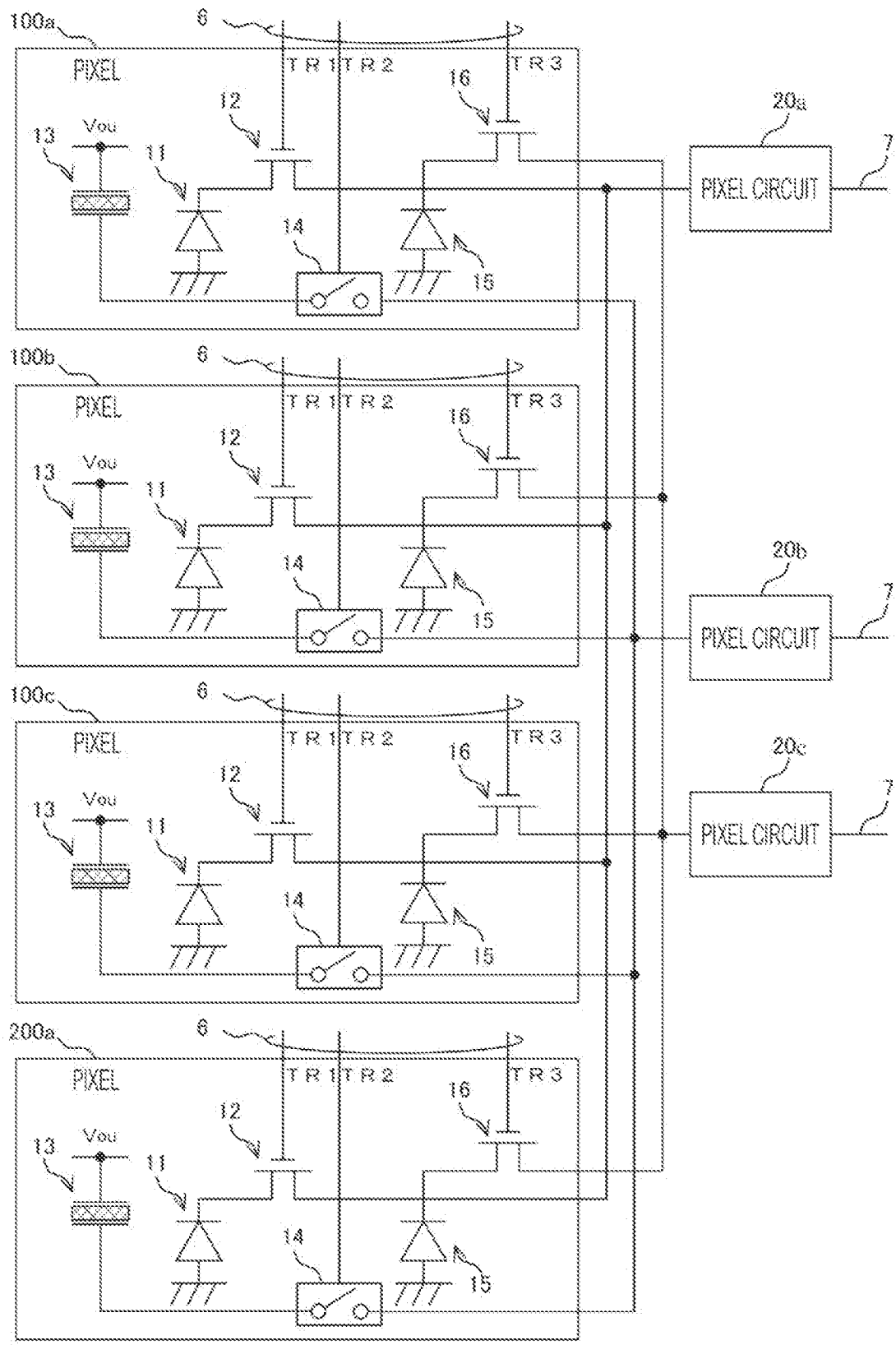
FIG. 15 is a circuit diagram illustrating a configuration example of a pixel according to a seventh embodiment of the present disclosure.

FIG. 15 is a circuit diagram illustrating a configuration example of a pixel according to the seventh embodiment of the present disclosure. A pixel 100 and a phase difference pixel 200 in the figure are different from the pixel 100 and the phase difference pixel 200 described in FIG. 10 in that a photoelectric conversion unit is further arranged. A circuit configuration will be described using the pixel 100 as an example. The pixel 100 in the figure is different from the pixel 100 described in FIG. 10 in that a photoelectric conversion unit 15 and a charge transfer unit 16 are further provided, and a pixel circuit 20c is further arranged.

Similarly to a photoelectric conversion unit 11, the photoelectric conversion unit 15 includes a photodiode formed in the semiconductor substrate 110. Furthermore, the charge transfer unit 16 includes a MOS transistor similarly to a charge transfer unit 12. Furthermore, a signal line 6 further includes a signal line TR3 that transmits a control signal to a gate of the charge transfer unit 16.

An anode of the photoelectric conversion unit 15 is grounded, and a cathode is connected to a source of the charge transfer unit 16. A gate of the charge transfer unit 16 is connected to the signal line TR3. Drains of the charge transfer units 16 of pixels 100*a*, 100*b*, and 100*c* and a phase difference pixel 200*a* are connected in common to a charge holding unit 21 of the pixel circuit 20*c*.

[Configuration of Pixel]

Figure 16:
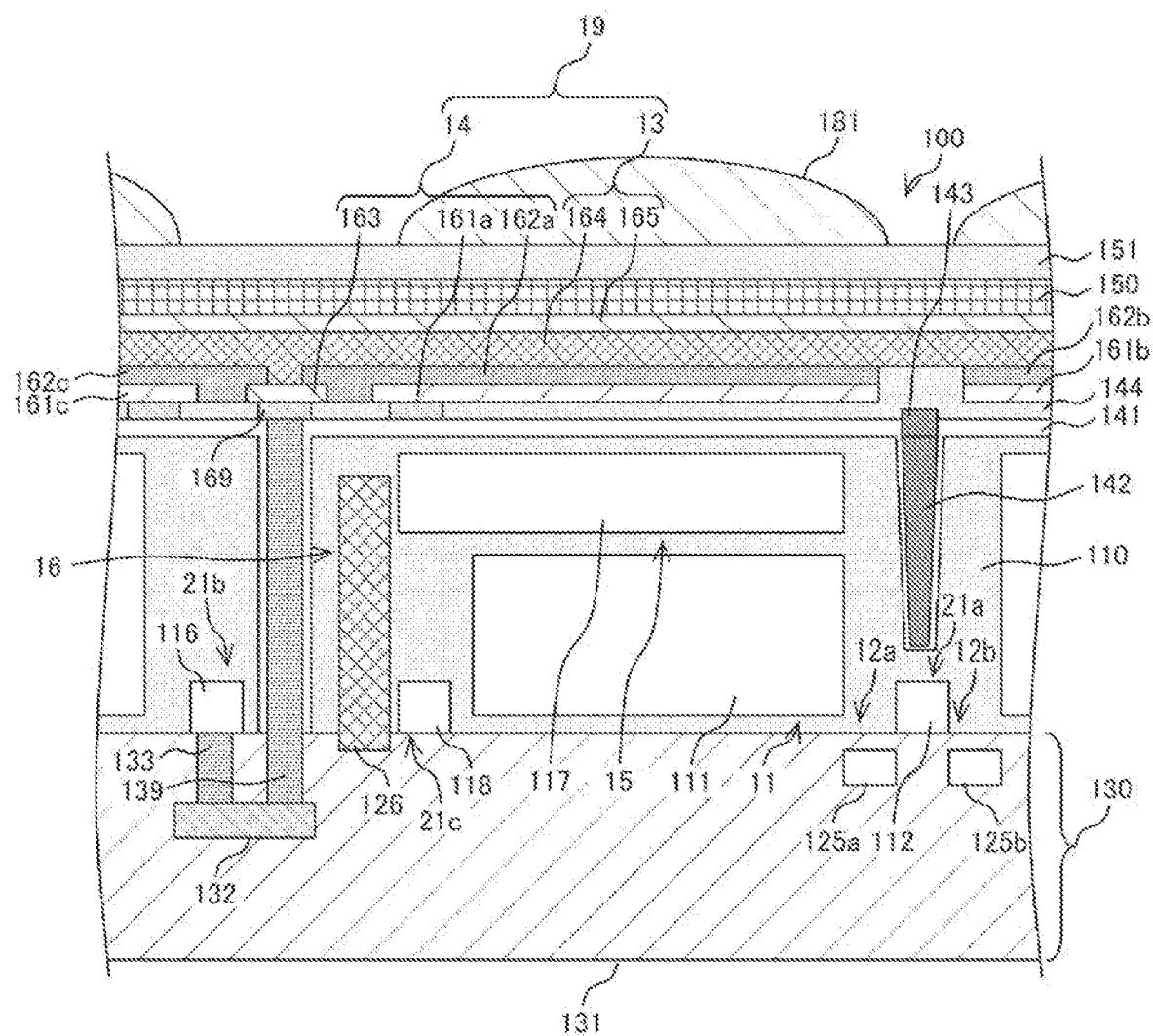
FIG. 16 is a cross-sectional view illustrating a configuration example of the pixel according to the seventh embodiment of the present disclosure.

FIG. 16 is a cross-sectional view illustrating a configuration example of a pixel according to the seventh embodiment of the present disclosure. The figure is, similarly to FIG. 11, a schematic cross-sectional view illustrating a configuration example of the pixel 100. The pixel 100 in the figure is different from the pixel 100 described in FIG. 11 in that the photoelectric conversion unit 15, the charge transfer unit 16, and a color filter 150 are further provided.

The photoelectric conversion unit 15 is arranged in the vicinity of a back surface of the semiconductor substrate 110. Specifically, an n-type semiconductor region 117 constituting the photoelectric conversion unit 15 is formed in a shallow region on a back surface side of the semiconductor substrate 110. On the other hand, an n-type semiconductor region 111 of the photoelectric conversion unit 11 is formed in a deep region of the semiconductor substrate 110. That is, the n-type semiconductor region 111 is arranged in the vicinity of a front surface of the semiconductor substrate 110.

An n-type semiconductor region 118 arranged in the semiconductor substrate 110 is a semiconductor region constituting a charge holding unit 21*c* of the pixel circuit 20*c*.

The charge transfer unit 16 is arranged adjacent to the n-type semiconductor region 117 of the photoelectric conversion unit 15. This charge transfer unit 16 is configured as a vertical transistor similarly to the charge transfer unit 12 described in FIG. 3. The charge transfer unit 16 includes a gate electrode 126. The charge transfer unit 16 transfers charges generated by the photoelectric conversion unit 15 arranged in the vicinity of the back surface of the semiconductor substrate 110, to the semiconductor region 118 of the charge holding unit 21 arranged on the front surface side of the semiconductor substrate 110.

Since the photoelectric conversion unit 19 including a photoelectric conversion film is arranged in a region closest to an on-chip lens 181, it is possible to adopt a configuration in which photoelectric conversion is performed by absorbing light having a short wavelength, for example, blue light. Since the photoelectric conversion unit 15 is arranged in a shallow region from the back surface of the semiconductor substrate 110, the photoelectric conversion unit 15 performs photoelectric conversion of light having a relatively short wavelength, for example, green light, in incident light transmitted through the photoelectric conversion unit 19. On the other hand, the photoelectric conversion unit 11 is arranged in a deep region from the back surface of the semiconductor substrate 110, and performs photoelectric conversion of light reaching the deep region of the semiconductor substrate 110, such as red light and infrared light. As described above, the pixel 100 in the figure can photoelectrically convert incident light in three wavelength ranges and generate an image signal corresponding to each light.

Note that, as the color filter 150, a color filter that shields ultraviolet light can be used. Furthermore, when the photoelectric conversion unit 11 performs photoelectric conversion of only red light, a color filter 150 that shields infrared light can be used.

[Configuration of Pixel Array Unit]

Figure 17:
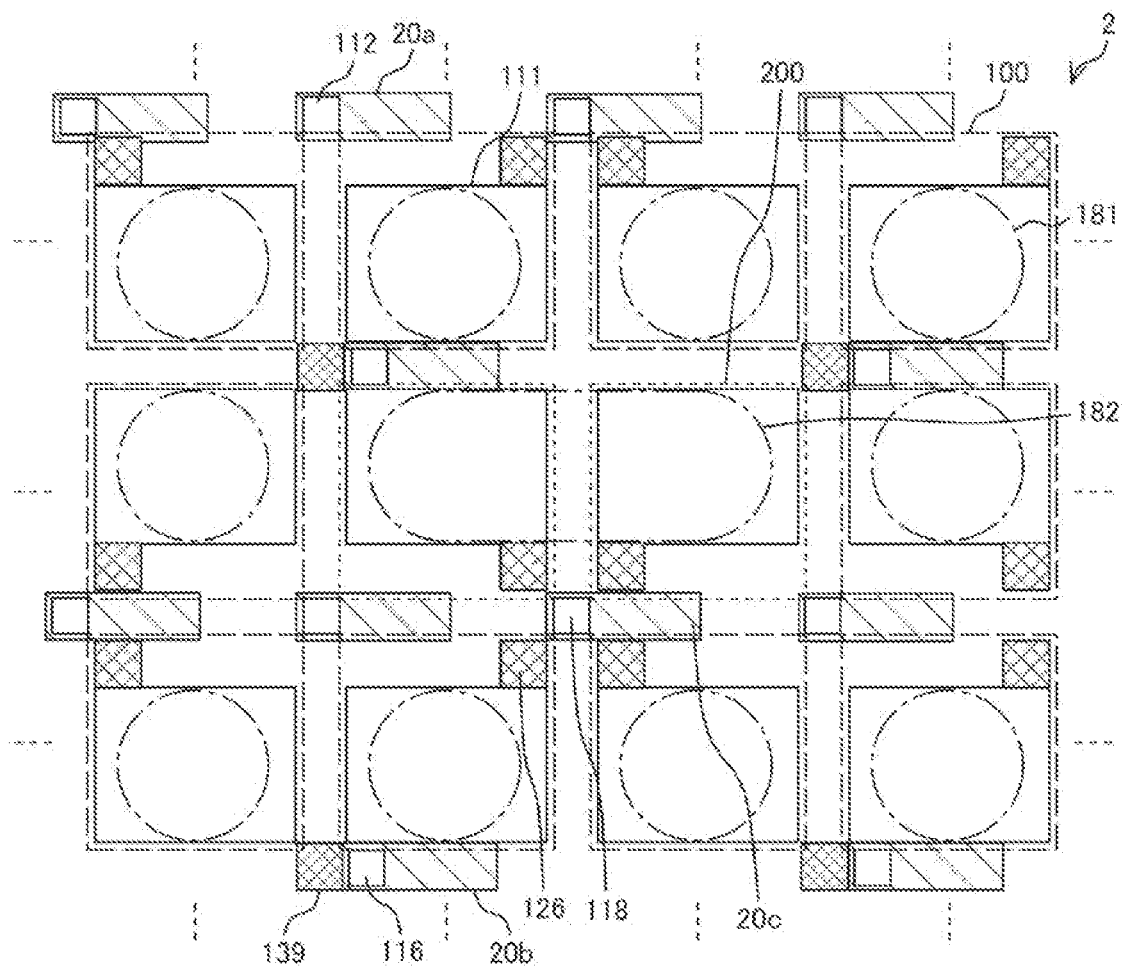
FIG. 17 is a view illustrating a configuration example of a pixel array unit according to the seventh embodiment of the present disclosure.

FIG. 17 is a view illustrating a configuration example of a pixel array unit according to the seventh embodiment of the present disclosure. The figure is, similarly to FIG. 12, a plan view illustrating a configuration example of the pixel 100 and the phase difference pixel 200 in a pixel array unit 2. There is a difference from the pixel array unit 2 described in FIG. 12 in that the pixel circuit 20*c* is further arranged and the gate electrode 126 is further arranged.

A pixel circuit 20*a* in the figure is arranged at a position shifted by one pixel from the pixel circuit 20*a* in FIG. 12. The pixel circuit 20*c* is arranged at a place where the pixel circuit 20*a* has been arranged in FIG. 12. Four gate electrodes 126 are arranged adjacent to the n-type semiconductor region 118 of the charge holding unit of this pixel circuit 20*c*.

The charge holding units 21 of the pixel circuits 20*a*, 20*b*, and 20*c* are all connected in common to the photoelectric conversion units 11 and the like of the four pixels 100 and the like.

As illustrated in the figure, a through electrode 139 and the gate electrode 126 (charge transfer unit 16) that do not contribute to photoelectric conversion are arranged in a region between a common on-chip lens 182 and the on-chip lens 181. Furthermore, the charge holding units 21 of the pixel circuits 20*a*, 20*b*, and 20*c* all are shared by the four pixels 100 and the like and connected. As a result, an n-type semiconductor region 112, the through electrode 139, and the gate electrode 126 can be individually arranged at a center of the four pixels 100 and the like. As a result, an output difference of image signals of the two phase difference pixels 200 can be reduced.

Since a configuration of the imaging element 1 other than this is similar to the configuration of the imaging element 1 described in the fourth embodiment of the present disclosure, the description thereof will be omitted.

As described above, in the imaging element 1 according to the seventh embodiment of the present disclosure, the charge transfer unit 16 having a gate electrode 121 and the through electrode 139, which are structures not contributing to photoelectric conversion, are arranged between the common on-chip lens 182 and the on-chip lens 181 of the pixel 100. As a result, a difference in image signals of the phase difference pixels 200 can be reduced, and an error in phase difference detection of the phase difference pixels 200 can be reduced.

Note that the configuration of the phase difference pixel 200 of the second embodiment may be combined with the third to seventh embodiments. That is, the separation unit 142 may be arranged in the semiconductor substrate 110 between the phase difference pixels 200 of the third to seventh embodiments.

<8. Application Example to Camera>

The technology (the present technology) according to the present disclosure can be applied to various products. For example, the present technology may be implemented as an imaging element mounted on an imaging apparatus such as a camera.

Figure 18:
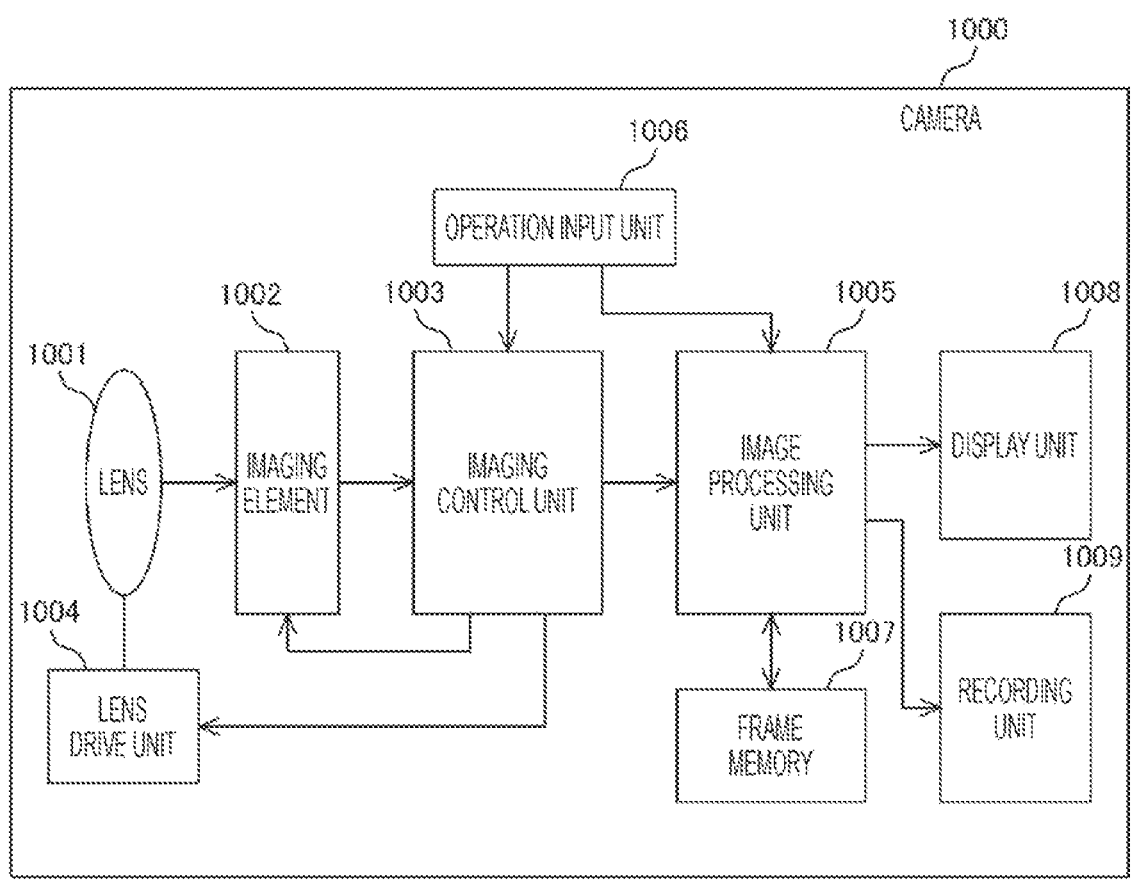
FIG. 18 is a block diagram illustrating a schematic configuration example of a camera that is an example of an imaging apparatus to which the present technology may be applied.

FIG. 18 is a block diagram illustrating a schematic configuration example of a camera that is an example of an imaging apparatus to which the present technology may be applied. A camera 1000 in the figure includes a lens 1001, an imaging element 1002, an imaging control unit 1003, a lens drive unit 1004, an image processing unit 1005, an operation input unit 1006, a frame memory 1007, a display unit 1008, and a recording unit 1009.

The lens 1001 is an imaging lens of the camera 1000. This lens 1001 collects light from a subject and causes the light to enter the imaging element 1002 described later to form an image of the subject.

The imaging element 1002 is a semiconductor element that images the light from the subject collected by the lens 1001. This imaging element 1002 generates an analog image signal corresponding to the irradiated light, converts into a digital image signal, and outputs.

The imaging control unit 1003 controls imaging in the imaging element 1002. This imaging control unit 1003 controls the imaging element 1002 by generating and outputting a control signal to the imaging element 1002. Furthermore, the imaging control unit 1003 can perform auto-focus in the camera 1000 on the basis of an image signal outputted from the imaging element 1002. Here, the auto-focus is a system that detects a focal position of the lens 1001 and automatically adjusts the focal position. As this auto-focus, it is also possible to use a method (image plane phase difference auto-focus) of detecting the focal position by detecting an image plane phase difference by using a phase difference pixel arranged in the imaging element 1002. Furthermore, it is also possible to apply a method (contrast auto-focus) of detecting, as a focal position, a position where a contrast of the image is the highest. The imaging control unit 1003 adjusts a position of the lens 1001 via the lens drive unit 1004 on the basis of the detected focal position, and performs the auto-focus. Note that the imaging control unit 1003 can include, for example, a digital signal processor (DSP) equipped with firmware.

The lens drive unit 1004 drives the lens 1001 on the basis of the control of the imaging control unit 1003. This lens drive unit 1004 can drive the lens 1001 by changing a position of the lens 1001 by using a built-in motor.

The image processing unit 1005 processes an image signal generated by the imaging element 1002. This processing corresponds to, for example, demosaic for generating an image signal of an insufficient color among image signals corresponding to red, green, and blue for each pixel, noise reduction for removing noise of the image signal, encoding of the image signal, and the like. The image processing unit 1005 can be configured by, for example, a microcomputer equipped with firmware.

The operation input unit 1006 receives an operation input from a user of the camera 1000. As this operation input unit 1006, for example, a push button or a touch panel can be used. The operation input received by the operation input unit 1006 is transmitted to the imaging control unit 1003 and the image processing unit 1005. Thereafter, processing according to the operation input, for example, processing such as imaging of the subject is started.

The frame memory 1007 is a memory that stores a frame that is an image signal for one screen. This frame memory 1007 is controlled by the image processing unit 1005 and holds the frame in a process of image processing.

The display unit 1008 displays an image processed by the image processing unit 1005. For example, a liquid crystal panel can be used as this display unit 1008.

The recording unit 1009 records an image processed by the image processing unit 1005. For example, a memory card or a hard disk can be used as this recording unit 1009.

The camera to which the present disclosure may be applied has been described above. The present technology may be applied to the imaging element 1002 among the configurations described above. Specifically, the imaging element 1 described in FIG. 1 can be applied to the imaging element 1002. By applying the imaging element 1 to the imaging element 1002, it is possible to reduce an error in phase difference detection, and prevent deterioration in image quality of an image when auto-focus is performed. The camera 1000 is an example of an imaging apparatus described in the claims. The image processing unit 1005 is an example of a processing circuit described in the claims.

Note that, here, the camera has been described as an example, but the technology according to the present disclosure may be applied to, for example, a monitoring device or the like. Furthermore, the present disclosure can also be applied to a semiconductor device in a form of a semiconductor module, in addition to an electronic device such as a camera. Specifically, the technology according to the present disclosure can also be applied to an imaging module that is a semiconductor module in which the imaging element 1002 and the imaging control unit 1003 in FIG. 18 are enclosed in one package.

<9. Application Example to Endoscopic Surgery System>

The technology according to the present disclosure can be applied to various products. For example, the technology according to the present disclosure may be applied to an endoscopic surgery system.

Figure 19:
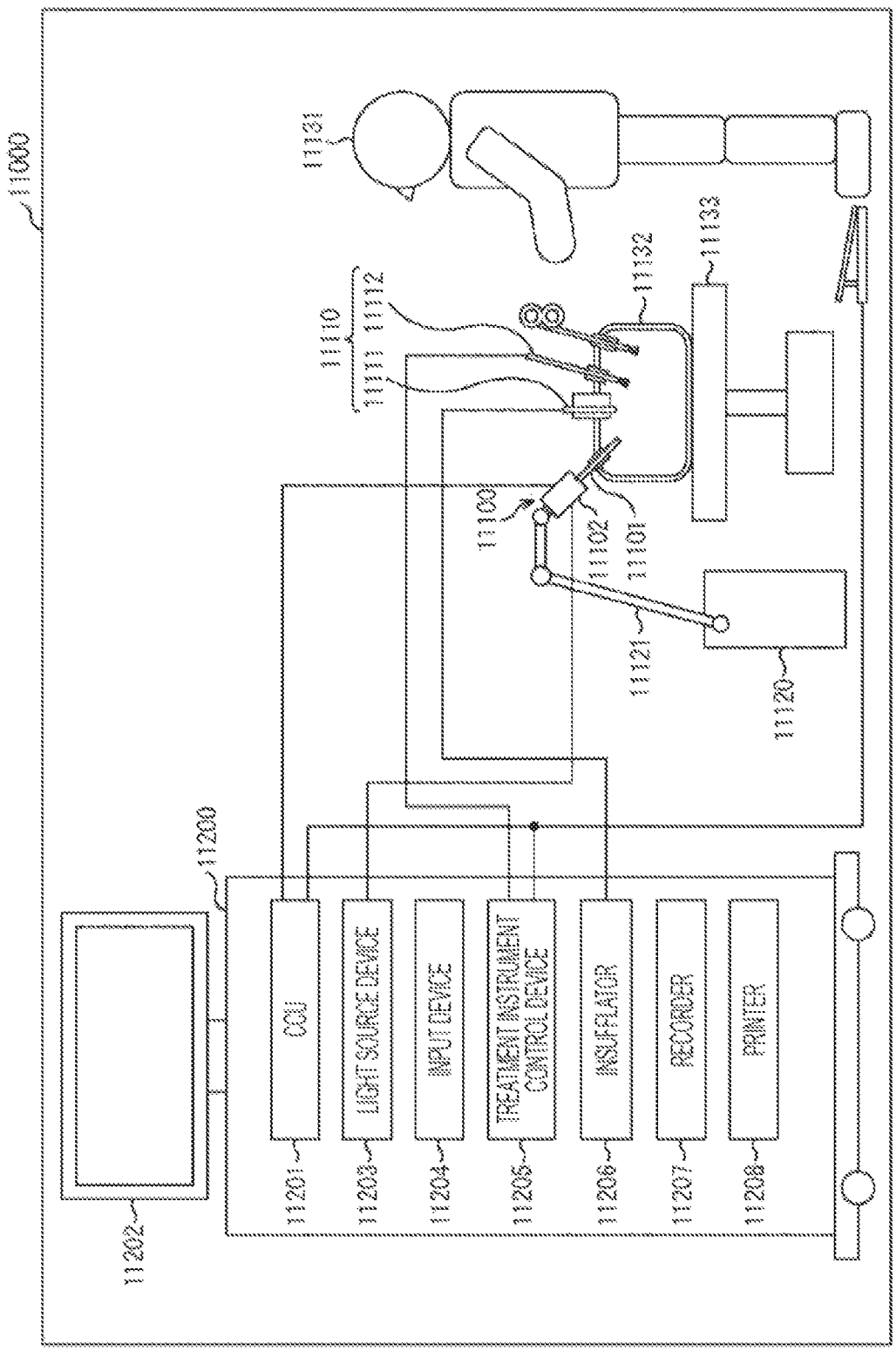
FIG. 19 is a view illustrating an example of a schematic configuration of an endoscopic surgery system.

FIG. 19 is a view illustrating an example of a schematic configuration of an endoscopic surgery system to which the technology according to the present disclosure may be applied.

FIG. 19 illustrates a state where an operator (a doctor) 11131 performs surgery on a patient 11132 on a patient bed 11133, by using an endoscopic surgery system 11000. As illustrated, the endoscopic surgery system 11000 includes: an endoscope 11100; other surgical instruments 11110 such as an insufflation tube 11111 and an energy treatment instrument 11112; a support arm device 11120 supporting the endoscope 11100; and a cart 11200 mounted with various devices for endoscopic surgery.

The endoscope 11100 includes a lens barrel 11101 whose region of a predetermined length from a distal end is inserted into a body cavity of the patient 11132, and a camera head 11102 connected to a proximal end of the lens barrel 11101. In the illustrated example, the endoscope 11100 configured as a so-called rigid endoscope having a rigid lens barrel 11101 is illustrated, but the endoscope 11100 may be configured as a so-called flexible endoscope having a flexible lens barrel.

At the distal end of the lens barrel 11101, an opening fitted with an objective lens is provided. The endoscope 11100 is connected with a light source device 11203, and light generated by the light source device 11203 is guided to the distal end of the lens barrel by a light guide extended inside the lens barrel 11101, and emitted toward an observation target in the body cavity of the patient 11132 through the objective lens. Note that the endoscope 11100 may be a forward-viewing endoscope, or may be an oblique-viewing endoscope or a side-viewing endoscope.

Inside the camera head 11102, an optical system and an imaging element are provided, and reflected light (observation light) from the observation target is collected on the imaging element by the optical system. The observation light is photoelectrically converted by the imaging element, and an electric signal corresponding to the observation light, in other words, an image signal corresponding to an observation image is generated. The image signal is transmitted to a camera control unit (CCU) 11201 as RAW data.

The CCU 11201 is configured by a central processing unit (CPU), a graphics processing unit (GPU), and the like, and integrally controls action of the endoscope 11100 and a display device 11202. Moreover, the CCU 11201 receives an image signal from the camera head 11102, and applies, on the image signal, various types of image processing for displaying an image on the basis of the image signal, for example, development processing (demosaicing processing) and the like.

The display device 11202 displays an image on the basis of the image signal subjected to the image processing by the CCU 11201, under the control of the CCU 11201.

The light source device 11203 is configured by a light source such as a light emitting diode (LED), for example, and supplies irradiation light at a time of capturing an image of the operative site or the like to the endoscope 11100.

An input device 11204 is an input interface to the endoscopic surgery system 11000. A user can input various types of information and input instructions to the endoscopic surgery system 11000 via the input device 11204. For example, the user inputs an instruction or the like for changing imaging conditions (a type of irradiation light, a magnification, a focal length, and the like) by the endoscope 11100.

A treatment instrument control device 11205 controls driving of the energy treatment instrument 11112 for ablation of a tissue, incision, sealing of a blood vessel, or the like. An insufflator 11206 sends gas into a body cavity through the insufflation tube 11111 in order to inflate the body cavity of the patient 11132 for the purpose of securing a visual field by the endoscope 11100 and securing a working space of the operator. A recorder 11207 is a device capable of recording various types of information regarding the surgery. A printer 11208 is a device capable of printing various types of information regarding the surgery in various forms such as text, images, and graphs.

Note that the light source device 11203 that supplies the endoscope 11100 with irradiation light for capturing an image of the operative site may include, for example, a white light source configured by an LED, a laser light source, or a combination thereof. In a case where the white light source is configured by a combination of RGB laser light sources, since output intensity and output timing of each color (each wavelength) can be controlled with high precision, the light source device 11203 can adjust white balance of a captured image. Furthermore, in this case, it is also possible to capture an image corresponding to each of RGB in a time division manner by irradiating the observation target with laser light from each of the RGB laser light sources in a time-division manner, and controlling driving of the imaging element of the camera head 11102 in synchronization with the irradiation timing. According to this method, it is possible to obtain a color image without providing a color filter in the imaging element.

Furthermore, driving of the light source device 11203 may be controlled to change intensity of the light to be outputted at every predetermined time interval. By acquiring images in a time-division manner by controlling the driving of the imaging element of the camera head 11102 in synchronization with the timing of the change of the light intensity, and combining the images, it is possible to generate an image of a high dynamic range without so-called black defects and whiteout.

Furthermore, the light source device 11203 may be configured to be able to supply light having a predetermined wavelength band corresponding to special light observation. In the special light observation, for example, so-called narrow band imaging is performed in which predetermined tissues such as blood vessels in a mucous membrane surface layer are imaged with high contrast by utilizing wavelength dependency of light absorption in body tissues and irradiating the predetermined tissues with narrow band light as compared to the irradiation light (in other words, white light) at the time of normal observation. Alternatively, in the special light observation, fluorescence observation for obtaining an image by fluorescence generated by irradiation of excitation light may be performed. In the fluorescence observation, it is possible to perform irradiating a body tissue with excitation light and observing fluorescence from the body tissue (autofluorescence observation), locally injecting a reagent such as indocyanine green (ICG) into a body tissue and irradiating the body tissue with excitation light corresponding to the fluorescence wavelength of the reagent to obtain a fluorescent image, or the like. The light source device 11203 may be configured to be able to supply narrow band light and/or excitation light corresponding to such special light observation.

Figure 20:
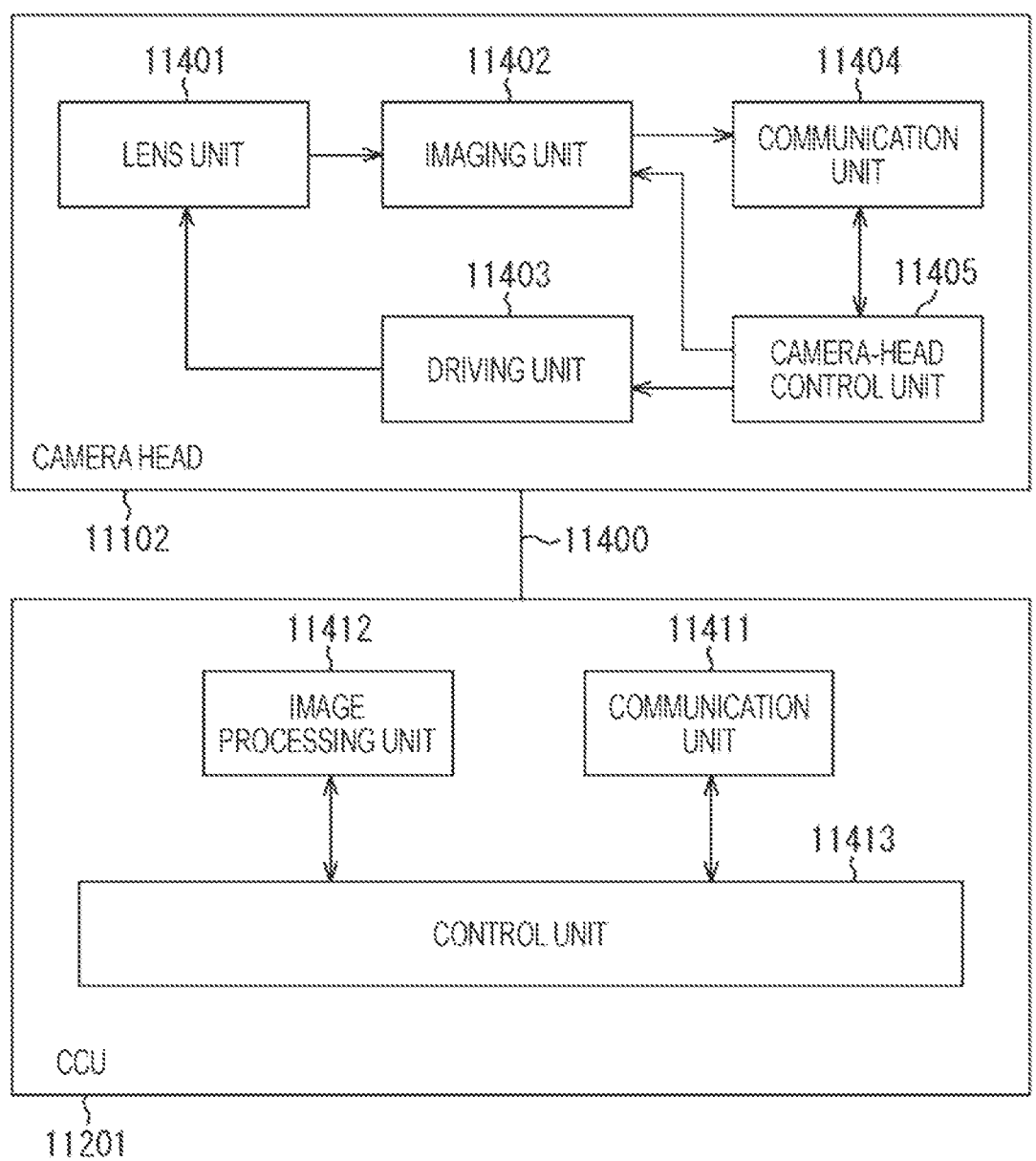
FIG. 20 is a block diagram illustrating an example of a functional configuration of a camera head and a CCU.

FIG. 20 is a block diagram illustrating an example of a functional configuration of the camera head 11102 and the CCU 11201 illustrated in FIG. 19.

The camera head 11102 has a lens unit 11401, an imaging unit 11402, a driving unit 11403, a communication unit 11404, and a camera-head control unit 11405. The CCU 11201 has a communication unit 11411, an image processing unit 11412, and a control unit 11413. The camera head 11102 and the CCU 11201 are communicably connected in both directions by a transmission cable 11400.

The lens unit 11401 is an optical system provided at a connection part with the lens barrel 11101. Observation light taken in from the distal end of the lens barrel 11101 is guided to the camera head 11102 and is incident on the lens unit 11401. The lens unit 11401 is configured by combining a plurality of lenses including a zoom lens and a focus lens.

The imaging unit 11402 includes an imaging element. The number of the imaging elements included in the imaging unit 11402 may be one (a so-called single plate type) or plural (a so-called multi-plate type). In a case where the imaging unit 11402 is configured with the multi-plate type, for example, individual imaging elements may generate image signals corresponding to RGB each, and a color image may be obtained by synthesizing them. Alternatively, the imaging unit 11402 may have a pair of imaging elements for respectively acquiring image signals for the right eye and the left eye corresponding to three-dimensional (3D) display. Performing 3D display enables the operator 11131 to more accurately grasp a depth of living tissues in the operative site. Note that, in a case where the imaging unit 11402 is configured as the multi-plate type, a plurality of systems of the lens unit 11401 may also be provided corresponding to individual imaging elements.

Furthermore, the imaging unit 11402 may not necessarily be provided in the camera head 11102. For example, the imaging unit 11402 may be provided inside the lens barrel 11101 immediately after the objective lens.

The driving unit 11403 is configured by an actuator, and moves the zoom lens and the focus lens of the lens unit 11401 along an optical axis by a predetermined distance under control from the camera-head control unit 11405. With this configuration, a magnification and focus of a captured image by the imaging unit 11402 may be appropriately adjusted.

The communication unit 11404 is configured by a communication device for exchange of various types of information between with the CCU 11201. The communication unit 11404 transmits an image signal obtained from the imaging unit 11402 to the CCU 11201 via the transmission cable 11400 as RAW data.

Furthermore, the communication unit 11404 receives a control signal for controlling driving of the camera head 11102 from the CCU 11201, and supplies to the camera-head control unit 11405. The control signal includes information regarding imaging conditions such as, for example, information of specifying a frame rate of a captured image, information of specifying an exposure value at the time of imaging, information of specifying a magnification and focus of a captured image, and/or the like.

Note that the imaging conditions described above such as a frame rate, an exposure value, magnification, and focus may be appropriately specified by the user, or may be automatically set by the control unit 11413 of the CCU 11201 on the basis of the acquired image signal. In the latter case, a so-called auto exposure (AE) function, auto focus (AF) function, and auto white balance (AWB) function are to be installed in the endoscope 11100.

The camera-head control unit 11405 controls driving of the camera head 11102 on the basis of the control signal from the CCU 11201 received via the communication unit 11404.

The communication unit 11411 is configured by a communication device for exchange of various types of information with the camera head 11102. The communication unit 11411 receives an image signal transmitted via the transmission cable 11400 from the camera head 11102.

Furthermore, the communication unit 11411 transmits, to the camera head 11102, a control signal for controlling driving of the camera head 11102. Image signals and control signals can be transmitted by telecommunication, optical communication, or the like.

The image processing unit 11412 performs various types of image processing on an image signal that is RAW data transmitted from the camera head 11102.

The control unit 11413 performs various types of control related to imaging of an operative site and the like by the endoscope 11100 and related to display of a captured image obtained by the imaging of the operative site and the like. For example, the control unit 11413 generates a control signal for controlling driving of the camera head 11102.

Furthermore, the control unit 11413 causes the display device 11202 to display a captured image in which the operative site or the like is shown, on the basis of the image signal subjected to the image processing by the image processing unit 11412. At this time, the control unit 11413 recognizes various objects in the captured image by using various image recognition techniques. For example, by detecting a shape, a color, and the like of an edge of the object included in the captured image, the control unit 11413 can recognize a surgical instrument such as forceps, a specific living site, bleeding, mist in using the energy treatment instrument 11112, and the like. When causing the display device 11202 to display the captured image, the control unit 11413 may use the recognition result to superimpose and display various types of surgery support information on the image of the operative site. By superimposing and displaying the surgical support information and presenting to the operator 11131, it becomes possible to reduce a burden on the operator 11131 and to allow the operator 11131 to reliably proceed with the surgery.

The transmission cable 11400 connecting the camera head 11102 and the CCU 11201 is an electric signal cable corresponding to communication of an electric signal, an optical fiber corresponding to optical communication, or a composite cable of these.

Here, in the illustrated example, communication is performed by wire communication using the transmission cable 11400, but communication between the camera head 11102 and the CCU 11201 may be performed wirelessly.

An example of the endoscopic surgery system to which the technology according to the present disclosure may be applied has been described above. The technology according to the present disclosure may be applied to the imaging unit 11402 of the camera head 11102 among the configurations described above. Specifically, the imaging element 1 in FIG. 1 can be applied to the imaging unit 10402. By applying the technology according to the present disclosure to the imaging unit 10402, for example, a clearer image of an operative site can be obtained, so that the operator can reliably check the surgical site.

Note that, here, the endoscopic surgery system has been described as an example, but the technology according to the present disclosure may be applied to other, for example, a microscopic surgery system or the like.

<10. Application Example to Mobile Object>

The technology according to the present disclosure can be applied to various products. For example, the technology according to the present disclosure may be realized as a device equipped on any type of mobile objects, such as an automobile, an electric car, a hybrid electric car, a motorcycle, a bicycle, personal mobility, an airplane, a drone, a ship, a robot, and the like.

Figure 21:
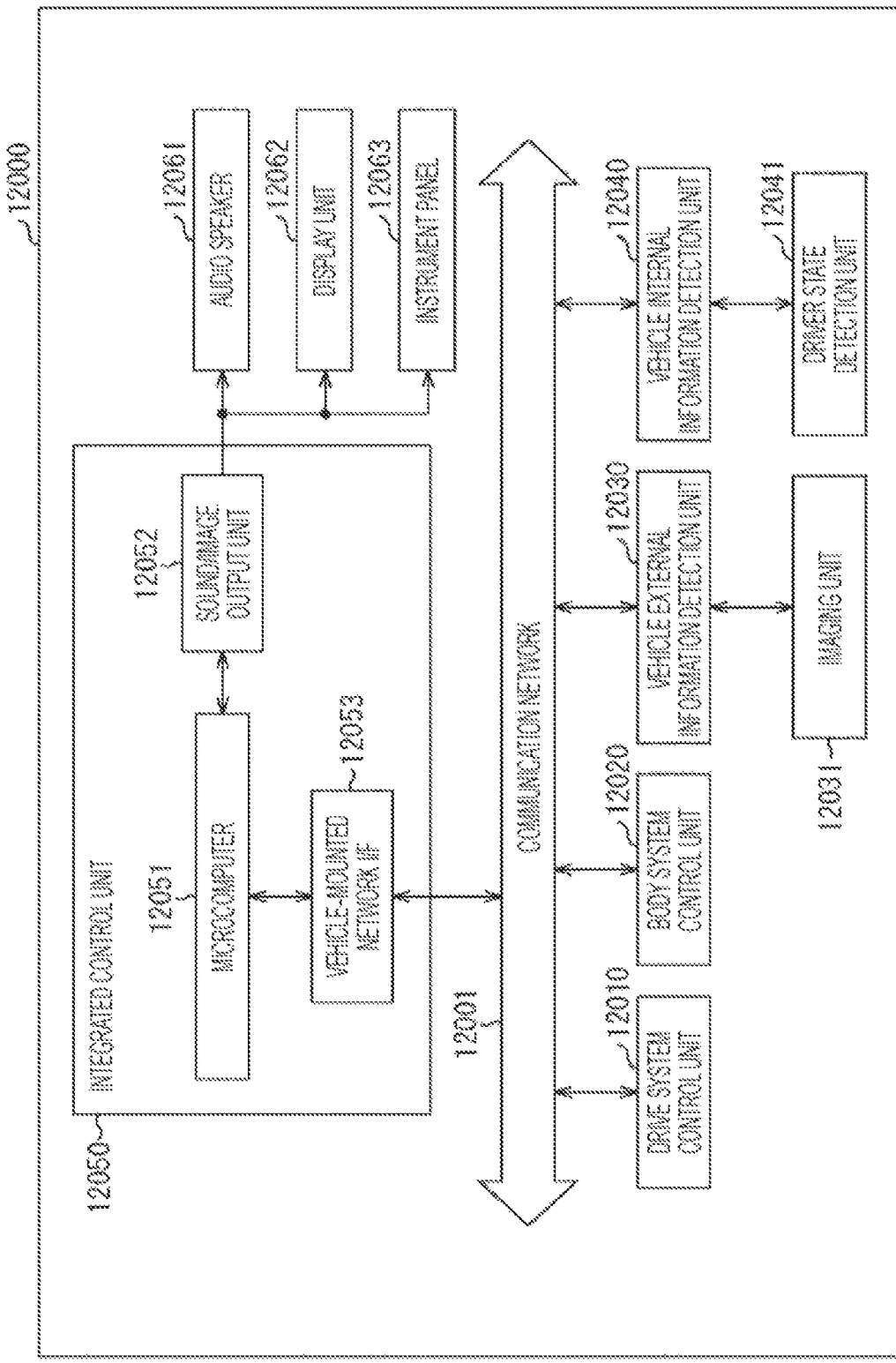
FIG. 21 is a block diagram illustrating an example of a schematic configuration of a vehicle control system.

FIG. 21 is a block diagram illustrating a schematic configuration example of a vehicle control system, which is an example of a mobile object control system to which the technology according to the present disclosure may be applied.

A vehicle control system 12000 includes a plurality of electronic control units connected via a communication network 12001. In the example illustrated in FIG. 21, the vehicle control system 12000 includes a drive system control unit 12010, a body system control unit 12020, a vehicle external information detection unit 12030, a vehicle internal information detection unit 12040, and an integrated control unit 12050. Furthermore, as a functional configuration of the integrated control unit 12050, a microcomputer 12051, a sound/image output unit 12052, and a vehicle-mounted network interface (I/F) 12053 are illustrated.

The drive system control unit 12010 controls an operation of devices related to a drive system of a vehicle in accordance with various programs. For example, the drive system control unit 12010 functions as a control device for the following devices: a driving force generation device for generation of a driving force of the vehicle such as an internal combustion engine or a drive motor; a driving force transmission mechanism for transmission of a driving force to wheels; a steering mechanism to adjust a steering angle of the vehicle; a braking device that generates a braking force of the vehicle; and the like.

The body system control unit 12020 controls an operation of various devices mounted on a vehicle body in accordance with various programs. For example, the body system control unit 12020 functions as a control device for a keyless entry system, a smart key system, a power window device, or various lamps such as a headlamp, a back lamp, a brake lamp, a turn indicator, or a fog lamp. In this case, the body system control unit 12020 may be inputted with radio waves or signals of various switches transmitted from a portable device that substitutes for a key. The body system control unit 12020 receives an input of these radio waves or signals, and controls a door lock device, a power window device, a lamp, and the like of the vehicle.

The vehicle external information detection unit 12030 detects information about an outside of the vehicle equipped with the vehicle control system 12000. For example, to the vehicle external information detection unit 12030, an imaging unit 12031 is connected. The vehicle external information detection unit 12030 causes the imaging unit 12031 to capture an image of an outside of the vehicle, and receives the captured image. The vehicle external information detection unit 12030 may perform an object detection process or a distance detection process for a person, a vehicle, an obstacle, a sign, a character on a road surface, or the like on the basis of the received image.

The imaging unit 12031 is an optical sensor that receives light and outputs an electric signal according to an amount of received light. The imaging unit 12031 can output the electric signal as an image, or can output as distance measurement information. Furthermore, the light received by the imaging unit 12031 may be visible light or non-visible light such as infrared light.

The vehicle internal information detection unit 12040 detects information inside the vehicle. The vehicle internal information detection unit 12040 is connected with, for example, a driver state detection unit 12041 that detects a state of a driver. The driver state detection unit 12041 may include, for example, a camera that images the driver, and, on the basis of detection information inputted from the driver state detection unit 12041, the vehicle internal information detection unit 12040 may calculate a degree of tiredness or a degree of concentration of the driver, or may determine whether or not the driver is asleep.

On the basis of information inside and outside the vehicle acquired by the vehicle external information detection unit 12030 or the vehicle internal information detection unit 12040, the microcomputer 12051 can operate a control target value of the driving force generation device, the steering mechanism, or the braking device, and output a control command to the drive system control unit 12010. For example, the microcomputer 12051 can perform cooperative control for the purpose of realizing functions of advanced driver assistance system (ADAS) including avoidance of collisions or mitigation of impacts of the vehicle, follow-up traveling on the basis of an inter-vehicle distance, vehicle speed maintenance traveling, vehicle collision warning, vehicle lane departure warning, and the like.

Furthermore, by controlling the driving force generation device, the steering mechanism, the braking device, or the like on the basis of the information about surroundings of the vehicle acquired by the vehicle external information detection unit 12030 or the vehicle internal information detection unit 12040, the microcomputer 12051 may perform cooperative control for the purpose of, for example, automatic driving for autonomously traveling without depending on an operation of the driver.

Furthermore, the microcomputer 12051 can output a control command to the body system control unit 12020 on the basis of information about the outside of the vehicle acquired by the vehicle external information detection unit 12030. For example, the microcomputer 12051 can control a headlamp in accordance with a position of a preceding vehicle or an oncoming vehicle detected by the vehicle external information detection unit 12030, and perform cooperative control for the purpose of antiglare, such as switching a high beam to a low beam.

The sound/image output unit 12052 transmits an output signal of at least one of sound or an image, to an output device capable of visually or audibly notifying, of information, a passenger of the vehicle or outside the vehicle. In the example of FIG. 21, an audio speaker 12061, a display unit 12062, and an instrument panel 12063 are exemplified as the output devices. The display unit 12062 may include, for example, at least one of an on-board display or a head-up display.

Figure 22:
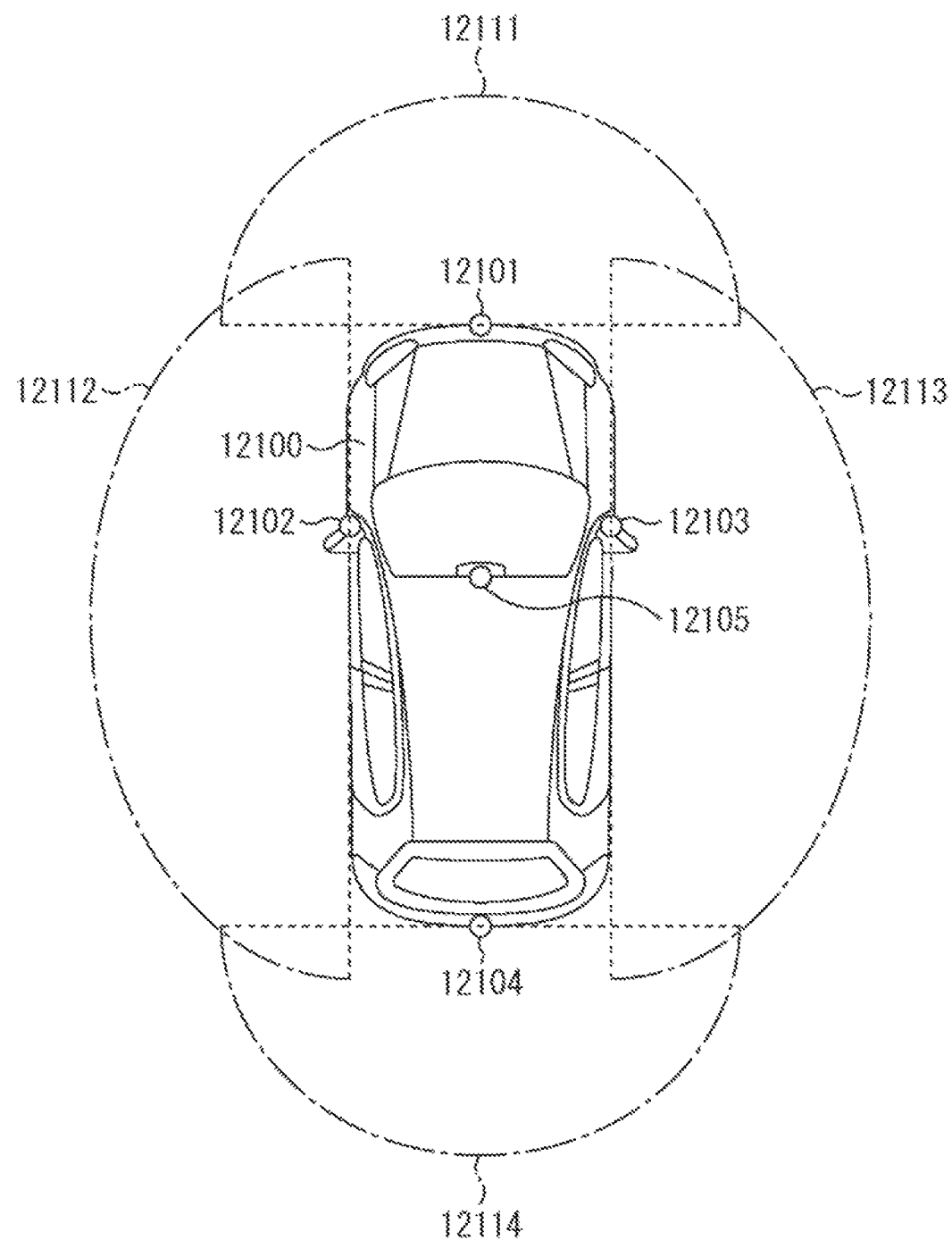
FIG. 22 is an explanatory view illustrating an example of an installation position of a vehicle external information detection unit and an imaging unit.

FIG. 22 is a view illustrating an example of an installation position of the imaging unit 12031.

In FIG. 22, as the imaging unit 12031, a vehicle 12100 includes imaging units 12101, 12102, 12103, 12104, and 12105.

The imaging units 12101, 12102, 12103, 12104, and 12105 are provided at, for example, a front nose, side mirrors, a rear bumper, a back door, an upper part of a windshield in a vehicle cabin, or the like of the vehicle 12100. The imaging unit 12101 provided at the front nose and the imaging unit 12105 provided at the upper part of the windshield in the vehicle cabin mainly acquire an image in front of the vehicle 12100. The imaging units 12102 and 12103 provided at the side mirrors mainly acquire an image of a side of the vehicle 12100. The imaging unit 12104 provided at the rear bumper or the back door mainly acquires an image behind the vehicle 12100. A front image acquired by the imaging units 12101 and 12105 is mainly used to detect preceding vehicles, pedestrians, obstacles, traffic lights, traffic signs, lanes, and the like.

Note that FIG. 22 illustrates an example of an image capturing range of the imaging units 12101 to 12104. An imaging range 12111 indicates an imaging range of the imaging unit 12101 provided at the front nose, imaging ranges 12112 and 12113 indicate imaging ranges of the imaging units 12102 and 12103 each provided at the side mirrors, and an imaging range 12114 indicates an imaging range of the imaging unit 12104 provided at the rear bumper or the back door. For example, by superimposing image data captured by the imaging units 12101 to 12104, an overhead view image of the vehicle 12100 viewed from above can be obtained.

At least one of the imaging units 12101 to 12104 may have a function of acquiring distance information. For example, at least one of the imaging units 12101 to 12104 may be a stereo camera including a plurality of imaging elements, or an imaging element having pixels for detecting a phase difference.

For example, on the basis of the distance information obtained from the imaging units 12101 to 12104, by obtaining a distance to each solid object within the imaging ranges 12111 to 12114 and a time change of this distance (a relative speed with respect to the vehicle 12100), the microcomputer 12051 can extract, as a preceding vehicle, especially a solid object that is the closest on a travel route of the vehicle 12100, and that is traveling at a predetermined speed (for example, 0 km/h or more) in substantially the same direction as the vehicle 12100. Moreover, the microcomputer 12051 can set an inter-vehicle distance to be secured from a preceding vehicle in advance, and perform automatic brake control (including follow-up stop control), automatic acceleration control (including follow-up start control), and the like. In this way, it is possible to perform cooperative control for the purpose of, for example, automatic driving for autonomously traveling without depending on an operation of the driver.

For example, on the basis of the distance information obtained from the imaging units 12101 to 12104, the microcomputer 12051 can classify solid object data regarding solid objects into a two-wheeled vehicle, an ordinary vehicle, a large vehicle, a pedestrian, a utility pole, and the like, to extract and use for automatic avoidance of obstacles. For example, the microcomputer 12051 distinguishes obstacles around the vehicle 12100 into obstacles that are visible to the driver of the vehicle 12100 and obstacles that are difficult to see. Then, the microcomputer 12051 can determine a collision risk indicating a risk of collision with each obstacle, and provide driving assistance for collision avoidance by outputting an alarm to the driver via the audio speaker 12061 or the display unit 12062, or by performing forced deceleration and avoidance steering via the drive system control unit 12010, when the collision risk is equal to or larger than a set value and there is a possibility of collision.

At least one of the imaging units 12101 to 12104 may be an infrared camera that detects infrared light. For example, the microcomputer 12051 can recognize a pedestrian by determining whether or not a pedestrian exists in a captured image of the imaging units 12101 to 12104. Such recognition of a pedestrian is performed by, for example, a procedure of extracting a feature point in a captured image of the imaging unit 12101 to 12104 as an infrared camera, and a procedure of performing pattern matching processing on a series of feature points indicating a contour of an object and determining whether or not the object is a pedestrian. When the microcomputer 12051 determines that a pedestrian is present in the image captured by the imaging units 12101 to 12104 and recognizes the pedestrian, the sound/image output unit 12052 controls the display unit 12062 so as to superimpose and display a rectangular contour line for emphasis on the recognized pedestrian. Furthermore, the sound/image output unit 12052 may control the display unit 12062 to display an icon or the like indicating a pedestrian at a desired position.

An example of the vehicle control system to which the technology according to the present disclosure may be applied has been described above. The technology according to the present disclosure may be applied to the imaging unit 12031 and the like among the configurations described above. Specifically, the imaging element 1 in FIG. 1 can be applied to the imaging unit 12031 and the like. By applying the technology according to the present disclosure to the imaging unit 12031 and the like, a clearer captured image can be obtained, so that driver's fatigue can be reduced.

Finally, the description of each of the above-described embodiments is an example of the present disclosure, and the present disclosure is not limited to the above-described embodiments. For this reason, it is needless to say that various modifications can be made according to the design and the like without departing from the technical idea according to the present disclosure even if other than the individual embodiments described above.

Furthermore, the effects described in the present specification are merely examples and are not limited. Furthermore, there may be other effects.

Furthermore, the drawings in the above-described embodiments are schematic, and dimensional ratios and the like of the individual units do not necessarily coincide with actual ones. Furthermore, naturally, even between the drawings, there is included a part in which a relation or a ratio of dimensions of those may differ from each other.

Note that the present technology can also have the following configurations.

(1) An imaging element including:
a pixel including a photoelectric conversion unit configured to perform photoelectric conversion in accordance with incident light and a charge transfer unit configured to transfer a charge generated by the photoelectric conversion;
an individual on-chip lens arranged for the pixel each and configured to individually collect the incident light;
a plurality of phase difference pixels each including the photoelectric conversion unit and the charge transfer unit and arranged adjacent to each other to detect a phase difference;
a common on-chip lens arranged in common for the plurality of phase difference pixels and configured to collect the incident light in common; and
a pixel circuit formed in a semiconductor substrate and configured to generate an image signal on the basis of the transferred charge, in which
the charge transfer units of the plurality of phase difference pixels are arranged in a region between the common on-chip lens and the individual on-chip lens.

(2) The imaging element according to the above-described (1), in which the pixel circuit is formed on a front surface side of the semiconductor substrate.

(3) The imaging element according to the above-described (2), in which the photoelectric conversion unit performs photoelectric conversion of the incident light incident on a back surface, the back surface being a surface formed on the semiconductor substrate and different from the front surface.

(4) The imaging element according to the above-described (3), in which the charge transfer unit includes a vertical transistor configured to transfer a charge in a thickness direction of the semiconductor substrate.

(5) The imaging element according to the above-described (2), in which the photoelectric conversion unit includes a photoelectric conversion film arranged adjacent to a back surface side of the semiconductor substrate.

(6) The imaging element according to the above-described (5), in which the charge transfer unit includes a through electrode that is an electrode penetrating the semiconductor substrate.

(7) The imaging element according to the above-described (5), further including a color filter that transmits light having a predetermined wavelength in the incident light.

(8) The imaging element according to the above-described (7), in which the color filter is arranged between the photoelectric conversion film, and the individual on-chip lens and the common on-chip lens.

(9) The imaging element according to the above-described (7), in which the color filter is arranged between the photoelectric conversion film and the semiconductor substrate.

(10) The imaging element according to any one of the above-described (1) to (9), further including a separation unit arranged between the photoelectric conversion units of the phase difference pixels.

(11) An imaging apparatus including:
a pixel including a photoelectric conversion unit configured to perform photoelectric conversion in accordance with incident light and a charge transfer unit configured to transfer a charge generated by the photoelectric conversion;
an individual on-chip lens arranged for the pixel each and configured to individually collect the incident light;

a plurality of phase difference pixels each including the photoelectric conversion unit and the charge transfer unit and arranged adjacent to each other to detect a phase difference;

a common on-chip lens arranged in common for the plurality of phase difference pixels and configured to collect the incident light in common;

a pixel circuit formed in a semiconductor substrate and configured to generate an image signal on the basis of the transferred charge; and a processing circuit configured to process the generated image signal, in which the charge transfer units of the plurality of phase difference pixels are arranged in a region between the common on-chip lens and the individual on-chip lens.

REFERENCE SIGNS LIST

1 Imaging element
2 Pixel array unit
4 Column signal processing unit
11, 13, 15, 19 Photoelectric conversion unit
12, 12a, 12b, 16 Charge transfer unit
14 Switch element
20, 20a, 20b, 20c Pixel circuit
21, 21a, 21b, 21c Charge holding unit
100, 100a, 100b, 100c Pixel
110 Semiconductor substrate
121, 121a, 121b, 122 to 124, 125a, 125b, 126 Gate electrode
139 Through electrode
142 Separation unit
150 Color filter
151 High refractive index film
161 Charge accumulation electrode
162 Insulating film
163 First electrode
164 Photoelectric conversion film
165 Second electrode
181 On-chip lens
182 Common on-chip lens
200, 200a Phase difference pixel
1000 Camera
1002 Imaging element
1005 Image processing unit
10402, 12031, 12101 to 12105 Imaging unit

What is claimed is:

1. An imaging element, comprising:
a pixel including a photoelectric converter configured to perform photoelectric conversion in accordance with incident light and a charge transfer circuit configured to transfer a charge generated by the photoelectric conversion;
an individual on-chip lens arranged for the pixel and configured to individually collect the incident light;
a plurality of phase difference pixels each including a photoelectric converter and a charge transfer circuit and arranged adjacent to each other to detect a phase difference;
a common on-chip lens arranged in common for the plurality of phase difference pixels and configured to collect the incident light in common; and
a pixel circuit formed in a semiconductor substrate and configured to generate an image signal based on the transferred charge,
wherein the charge transfer circuits of the plurality of phase difference pixels are arranged entirely in a region between an outer edge of the common on-chip lens and an outer edge of the individual on-chip lens in a plan view.

2. The imaging element according to claim 1, wherein the pixel circuit is formed on a front surface side of the semiconductor substrate.

3. The imaging element according to claim 2, wherein the photoelectric converter performs photoelectric conversion of the incident light incident on a back surface, the back surface being a surface formed on the semiconductor substrate and different from the front surface.

4. The imaging element according to claim 3, wherein the charge transfer circuit includes a vertical transistor configured to transfer a charge in a thickness direction of the semiconductor substrate.

5. The imaging element according to claim 2, wherein the photoelectric converter includes a photoelectric conversion film arranged adjacent to a back surface side of the semiconductor substrate.

6. The imaging element according to claim 5, wherein the charge transfer circuit includes a through electrode that is an electrode penetrating the semiconductor substrate.

7. The imaging element according to claim 5, further comprising a color filter that transmits light having a predetermined wavelength in the incident light.

8. The imaging element according to claim 7, wherein the color filter is arranged between the photoelectric conversion film, and the individual on-chip lens and the common on-chip lens.

9. The imaging element according to claim 7, wherein the color filter is arranged between the photoelectric conversion film and the semiconductor substrate.

10. The imaging element according to claim 1, further comprising a separator arranged between the photoelectric converters of the plurality of phase difference pixels.

11. The imaging apparatus according to claim 1, wherein the plurality of phase difference pixels includes a pair of phase difference pixels.

12. The imaging apparatus according to claim 11, wherein the common on-chip lens has an oval configuration.

13. The imaging apparatus according to claim 11, further comprising a plurality of pixels, wherein the plurality of pixels is provided around the pair of phase difference pixels on each side of the pair of phase difference pixels.

14. An imaging apparatus, comprising:
a pixel including a photoelectric converter configured to perform photoelectric conversion in accordance with incident light and a charge transfer circuit configured to transfer a charge generated by the photoelectric conversion;
an individual on-chip lens arranged for the pixel and configured to individually collect the incident light;
a plurality of phase difference pixels each including a photoelectric converter and a charge transfer circuit and arranged adjacent to each other to detect a phase difference;
a common on-chip lens arranged in common for the plurality of phase difference pixels and configured to collect the incident light in common;
a pixel circuit formed in a semiconductor substrate and configured to generate an image signal based on the transferred charge; and
a processing circuit configured to process the generated image signal,
wherein the charge transfer circuits of the plurality of phase difference pixels are arranged entirely in a region between an outer edge of the common on-chip lens and an outer edge of the individual on-chip lens in a plan view.

15. The imaging apparatus according to claim 14, wherein the plurality of phase difference pixels includes a pair of phase difference pixels.

16. The imaging apparatus according to claim 15, wherein the common on-chip lens has an oval configuration.

17. The imaging apparatus according to claim 15, further comprising a plurality of pixels, wherein the plurality of pixels is provided around the pair of phase difference pixels on each side of the pair of phase difference pixels.

18. The imaging apparatus according to claim 14, wherein the pixel circuit is formed on a front surface side of the semiconductor substrate.

19. The imaging apparatus according to claim 18, wherein the photoelectric converter performs photoelectric conversion of the incident light incident on a back surface, the back surface being a surface formed on the semiconductor substrate and different from the front surface.

20. The imaging apparatus according to claim 19, wherein the charge transfer circuit includes a vertical transistor configured to transfer a charge in a thickness direction of the semiconductor substrate.

* * * * *